(12) United States Patent
Inaba

(10) Patent No.: US 8,681,538 B2
(45) Date of Patent: Mar. 25, 2014

(54) SEMICONDUCTOR STORAGE DEVICE

(75) Inventor: Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 168 days.

(21) Appl. No.: 13/424,798

(22) Filed: Mar. 20, 2012

(65) Prior Publication Data

US 2012/0243286 A1 Sep. 27, 2012

(30) Foreign Application Priority Data

Mar. 25, 2011 (JP) .................................. 2011-68661

(51) Int. Cl.
*G11C 11/00* (2006.01)
(52) U.S. Cl.
USPC ............. 365/158; 365/173; 365/50; 365/130; 365/171; 365/230.07
(58) Field of Classification Search
USPC ......... 365/158, 48, 50, 130, 171, 173, 230.07
See application file for complete search history.

(56) References Cited

U.S. PATENT DOCUMENTS

| | | | |
|---|---|---|---|
| 5,695,864 | A | 12/1997 | Slonczewski |
| 7,457,150 | B2 | 11/2008 | Tsuchida et al. |
| 7,529,114 | B2 | 5/2009 | Asao |
| 7,545,672 | B2 | 6/2009 | Ueda et al. |
| 7,755,077 | B2 | 7/2010 | Inaba |
| 7,813,159 | B2 | 10/2010 | Inaba |
| 2005/0139880 | A1 | 6/2005 | Cha |
| 2006/0120147 | A1 * | 6/2006 | Peng et al. ................... 365/158 |
| 2009/0014703 | A1 | 1/2009 | Inaba |
| 2010/0103718 | A1 | 4/2010 | Asao et al. |
| 2010/0232210 | A1 | 9/2010 | Kajiyama et al. |
| 2010/0237321 | A1 | 9/2010 | Inaba |
| 2011/0069534 | A1 | 3/2011 | Inaba |
| 2012/0002462 | A1 | 1/2012 | Inaba |

FOREIGN PATENT DOCUMENTS

| | | |
|---|---|---|
| JP | 2005-071500 | 3/2005 |
| JP | 2005-191523 | 7/2005 |
| JP | 2008-091703 A | 4/2008 |
| JP | 2008-192990 | 8/2008 |
| JP | 2010-219098 | 9/2010 |

OTHER PUBLICATIONS

Office Action, mailed Jul. 16, 2013, in corresponding Japanese Application No. 2011-068661.
Background Art Information Sheet in 3 pages, dated Nov. 16, 2011.

* cited by examiner

*Primary Examiner* — Jason Lappas
(74) *Attorney, Agent, or Firm* — Knobbe, Martens, Olson & Bear, LLP

(57) ABSTRACT

A semiconductor storage device according to the present embodiment includes a plurality of bit lines, a plurality of word lines, and a plurality of memory cells each including a storage element and a switching element which are connected in series between adjacently paired ones of the bit lines. Gates of the switching elements of the memory cells connected between one of the adjacently paired ones of the bit lines are respectively connected to different ones of the word lines. A plurality of the storage elements and a plurality of the switching elements of the adjacent memory cells are alternately connected in series.

16 Claims, 18 Drawing Sheets

SEMICONDUCTOR STORAGE DEVICE

CROSS REFERENCE TO RELATED APPLICATIONS

This application is based upon and claims the benefit of priority from the prior Japanese Patent Application No. 2011-68661, filed on Mar. 25, 2011, the entire contents of which are incorporated herein by reference.

FIELD

The embodiments of the present invention relate to a semiconductor storage device.

BACKGROUND

In recent years, development of nonvolatile semiconductor storage devices that use resistance elements as storage elements such as an MRAM (Magnetoresistive Random Access Memory), a PCRAM (Phase Change Random Access Memory), and an RRAM (Resistive Random Access Memory) is underway.

As for the MRAM among these storage devices, magnetic field writing and spin-transfer torque writing are normally known as data writing techniques and these techniques are advantageous in high speed processing because of the use of the magnetization reversal of magnetic bodies. The spin-transfer torque writing has a characteristic such that a spin injection current becomes smaller in an amount necessary for magnetization reversal as magnetic bodies is smaller in size. The amount of a current necessary for spin-transfer magnetization reversal (a reversal threshold current) is defined by the density of a current flowing to a magnetoresistive element (an MTJ element). For this reason, the reversal threshold current decreases as the area of the MTJ element is reduced. That is, when the area of the MTJ element is reduced, the reversal threshold current is downscaled. Therefore, the MRAM based on the spin-transfer torque writing is advantageous in high integration, low power consumption, and high performance, and is expected as a nonvolatile semiconductor storage device that can replace a DRAM.

However, in conventional memory cell layouts, MTJ elements are not arranged uniformly on a semiconductor substrate and some adjacent MTJ elements are arranged at a smaller interval. Therefore, the MRAM has problems such that it is more difficult to perform exposure and processing in lithographic and etching steps with the progress of downscaling.

Meanwhile, there has been known a method of apparently uniformly arranging MTJ elements on a semiconductor substrate by arranging dummy MTJ elements in the spaces between adjacent MTJ elements. In this method, a stable shape is ensured for the MTJ elements because of the uniform arrangement; however, this method disadvantageously creates other problems in processing steps such as the need to selectively and electrically isolate only the dummy MTJ elements from other electrodes, wirings, and the like. In addition, the memory size cannot be reduced for the area by which the dummy MTJ elements are arranged. Under these circumstances, conventional MRAMs cannot simultaneously meet the demands of downscaling and mass storage capacity.

DETAILED DESCRIPTION

A semiconductor storage device according to the present embodiment comprises a plurality of bit lines, a plurality of word lines, and a plurality of memory cells each including a storage element and a switching element which are connected in series between adjacently paired ones of the bit lines. Gates of the switching elements of the memory cells connected between one of the adjacently paired ones of the bit lines are respectively connected to different ones of the word lines. A plurality of the storage elements and a plurality of the switching elements of the adjacent memory cells are alternately connected in series.

Embodiments will now be explained with reference to the accompanying drawings. The present invention is not limited to the embodiments.

First Embodiment

Figure 1:
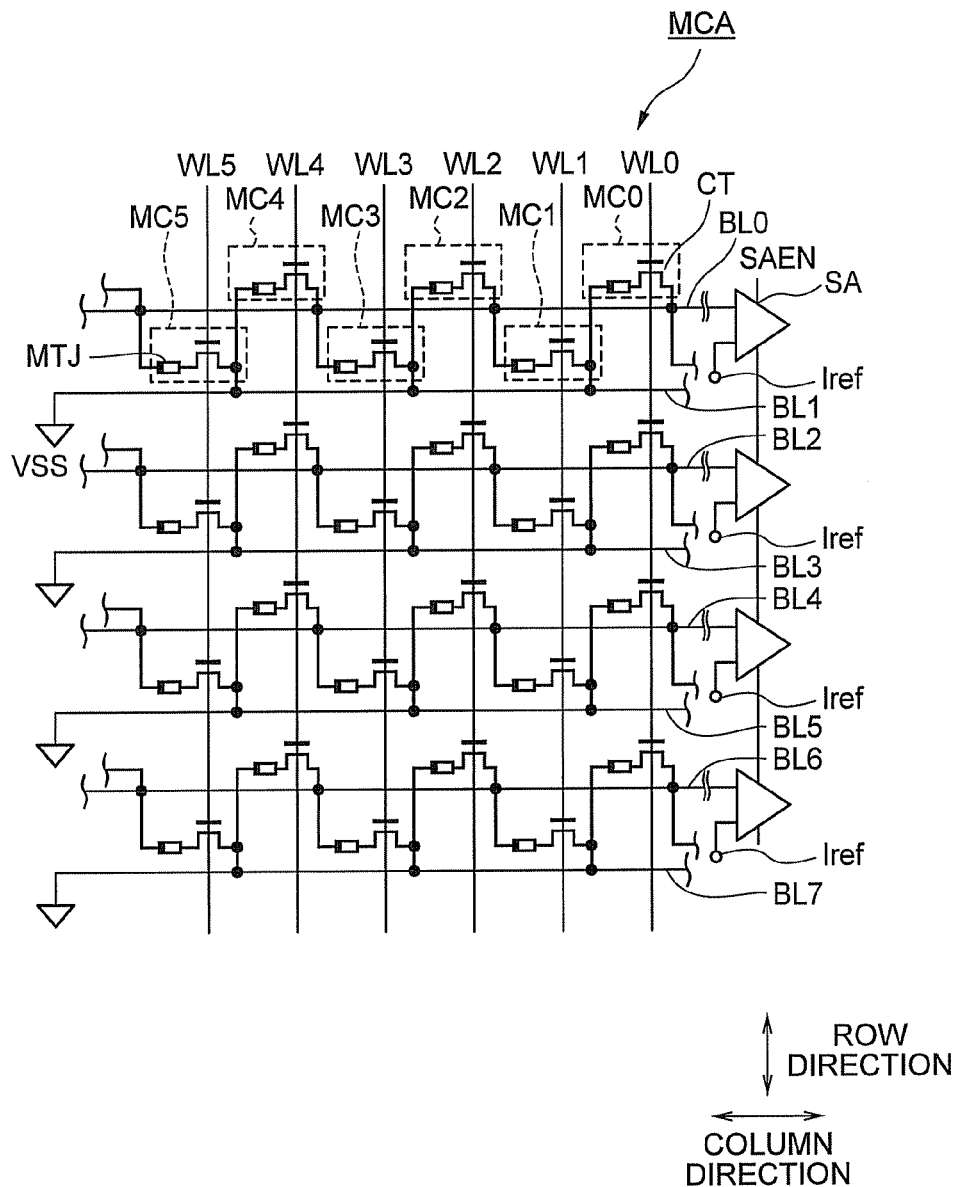
FIG. 1 is a schematic diagram showing a configuration example of a memory cell array MCA in an MRAM according to a first embodiment.

FIG. 1 is a schematic diagram showing a configuration example of a memory cell array MCA in an MRAM according to a first embodiment. The memory cell array MCA includes a plurality of memory cells MC arranged two-dimensionally in a matrix. The memory cells MC are arranged to correspond to intersections between adjacently paired bit lines BLi and BLi+1, where i is an integer, and word lines WLi, respectively. The bit lines BLi extend in a column direction that serves as a first direction, and the word lines WLi extend in a row direction that serves as a second direction.

Each memory cell MC includes a magnetic tunnel junction (MTJ) element and a cell transistor CT as a switching element connected in series between the paired bit lines BLi and BLi+1. Gates of the cell transistors CT of the memory cells MC connected between the paired bit lines BLi and BLi+1 are connected to different word lines WLi, respectively. For example, the gates of the cell transistors CT of first to sixth memory cells MC0 to MC5 are connected to word lines WL0 to WL5, respectively.

Furthermore, in the first embodiment, the MTJ elements of the first memory cell MC0, among the memory cells MC1 connected between the paired bit lines BLi and BLi+1, is connected to one end (drain or source) of the cell transistor CT of the second memory cell MC1 adjacent to the first memory cell MC0. The MTJ element of the second memory cell MC1 is connected to one end (drain or source) of the cell transistor CT of the third memory cell MC2 further adjacent to the second memory cell MC1. That is, the MTJ element of one memory cell MCi is connected to one end (drain or source) of the cell transistor CT of the memory cell MCi+1 further adjacent to the memory cell MCi. In this manner, in the first embodiment, the memory cells MCi connected between the adjacently paired bit lines BLi and BLi+1 are connected between the same paired bit lines BLi and BLi+1 and configured so that the MTJ elements and the cell transistors CT are alternately connected in series. That is, between the adjacently paired bit lines BLi and BLi+1, the MTJ elements and the cell transistors CT are alternately connected in series in the order of, for example, CT, MTJ, CT, MTJ, CT, MTJ, CT, MTJ, and the like.

Further, one end of the cell transistor CT of each memory cell MCi is connected to the bit line BLi or BLi+1 alternately in the order of i and i+1. That is, one end of the cell transistor CT of the memory cell MC0 is connected to the bit line BL0, that of the cell transistor CT of the memory cell MC1 is connected to the bit line BL1, that of the cell transistor CT of the memory cell MC2 is connected to the bit line BL0, and that of the cell transistor CT of the memory cell MC3 is connected to the bit line BL1.

One of each pair of bit lines BLi and BLi+1, that is, the bit line BLi is connected to a sense amplifier SA, and the other bit line BLi+1 is connected to a reference potential VSS (for example, ground). The sense amplifier SA carries a current to each MTJ element via the bit line BLi and compares a cell current Icell flowing to the MTJ element with a reference current Iref. The sense amplifier SA thereby detects a logical state of data stored in the memory cell MCi.

Currents flowing to the MTJ elements of the two memory cells MCi and MCi+1 adjacent in the row direction are opposite in a current flow direction. For example, the current flowing to the memory cell MC0 is in the direction from the cell transistor CT to the MTJ element (see the arrow A2 shown in FIG. 2). The current flowing to the memory cell MC1 is in the direction from the MTJ element to the cell transistor CT (see the arrow A1 shown in FIG. 2). Therefore, in the first embodiment, each of the sense amplifiers SA needs to detect the currents flowing to the memory cells MC in the two directions. In this case, it suffices to connect each of the sense amplifiers SA to one of the paired bit lines BLi and BLi+1. This can make the connection arrangement between the sense amplifiers SA and the bit lines BL simpler. It also suffices to provide the sense amplifiers SA for every pair of bit lines BLi and BLi+1. This can decrease the number of the sense amplifiers SA. This contributes to reducing the chip size of the MRAM.

Figure 2:
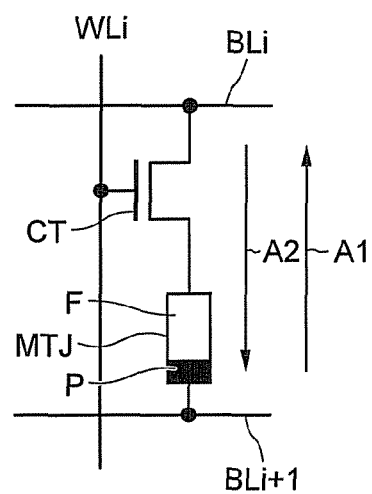
FIG. 2 is an explanatory diagram showing a configuration and an operation of a single memory cell MC.

FIG. 2 is an explanatory diagram showing a configuration and an operation of a single memory cell MC. Each memory cell MC includes the MTJ element serving as a storage element and the cell transistor CT. The MTJ element and the cell transistor CT are connected in series between the two bit lines BLi and BLi+1. In FIG. 2, the cell transistor CT is arranged near the bit line BLi and the MTJ element is arranged near the bit line BLi+1. However, there are cases where the MTJ element is arranged near the bit line BLi and the cell transistor CT is arranged near the bit line BLi+1 as in the case of the memory cells MC1, MC3, and MC5 shown in FIG. 1. The gate of the cell transistor CT is connected to one word line WL.

The MTJ element that uses the TMR (tunneling magnetoresistive) effect has a stacked structure in which a nonmagnetic layer (tunnel dielectric film) is sandwiched between two ferromagnetic layers. The MTJ element stores therein digital data by a change in a magnetic resistance due to the spin-polarized tunneling. The MTJ element can be set in a low resistance state or a high resistance state depending on magnetization orientations of the two ferromagnetic layers. For example, when it is defined that the low resistance state indicates data "0" and that the high resistance state indicates data "1", one-bit data can be recorded in the MTJ element. Alternatively, it can be defined that the low resistance state indicates data "1" and that the high resistance state indicates data "0". For example, the MTJ element is configured to sequentially stack a pinned layer P, a tunnel barrier layer, and a recording layer F. The pinned layer P and the recording layer F are made of a ferromagnetic body and the tunnel barrier layer is an insulating film. The pinned layer P has a fixed magnetization orientation. The recording layer F has a variable magnetization orientation. The MTJ element stores therein data depending on the magnetization orientation of the recording layer F.

At the time of a data write operation, when a current equal to or higher than a write threshold current flows to the MTJ element in an arrow A1 direction, the magnetization orientation of the recording layer F becomes anti-parallel to that of the pinned layer P. The MTJ element thereby turns into the high resistance state (data "1"). At the time of the data write operation, when the current equal to or higher than the write threshold current flows to the MTJ element in an arrow A2 direction, the magnetization orientation of the recording layer F becomes parallel to that of the pinned layer P. The MTJ element thereby turns into the low resistance state (data "0"). In this manner, different data can be written to the MTJ element depending on the current flow direction.

FIG. 2 shows an example in which the pinned layer P is connected to the bit line BLi+1 and the recording layer F is connected to the cell transistor CT. Conversely, the memory cell MC can be configured so that the recording layer F is connected to the bit line BLi+1 and that the pinned layer P is connected to the cell transistor CT. In the latter case, the polarity of the written data is reversed with respect to that shown in FIG. 2.

At the time of a data read operation, when a read voltage is applied to the memory cells MC0, MC2, and MC4 in the arrow A2 direction, the cell current Icell in response to the resistance state of the MTJ element in each of the memory cells MC0, MC2, and MC4 flows to the bit line BL0. The sense amplifier SA detects the logical state of the MTJ element by comparing the cell current Icell with the reference current Iref.

Furthermore, when the read voltage is applied to the memory cells MC1, MC3, and MC5 in the arrow A1 direction, the cell current Icell in response to the resistance state of the MTJ element in each of the memory cells MC1, MC3, and MC5 flows to the bit line BL0. The sense amplifier SA detects the logical state of the MTJ element by comparing the cell current Icell with the reference current Iref.

Figure 3:
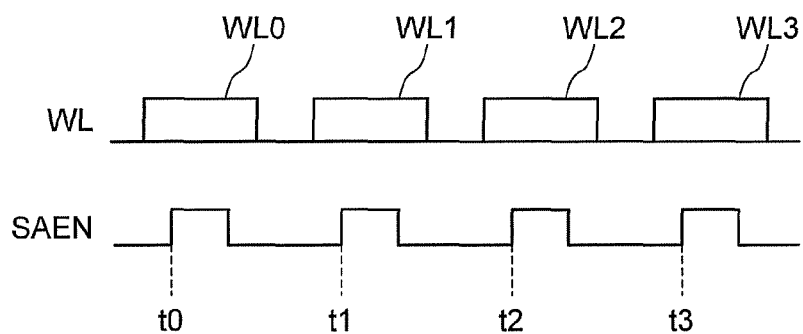
FIG. 3 is a timing diagram showing voltages of the word lines WLi and that of a sense-amplifier enable signal SAEN at the time of a data read operation.

FIG. 3 is a timing diagram showing voltages of the word lines WLi and that of a sense-amplifier enable signal SAEN at the time of a data read operation. For example, the word lines WL0 to WL3 are activated in this order. The sense-amplifier enable signal SAEN is activated at the timing of the activation of the word lines WL0 to WL3. Preferably, the sense-amplifier enable signal SAEN is activated after the cell current Icell becomes stable following the activation of the word lines WL0 to WL3.

With this configuration, at a time t0, the sense amplifiers SA in respective columns detect data stored in the memory cells MC connected to the word line WL0 via the bit lines BL0, BL2, BL4, BL6, and the like. At a time t1, the sense amplifiers SA in the respective columns detect data stored in the memory cells MC connected to the word line WL1 via the bit lines BL0, BL2, BL4, BL6, and the like. At a time t2, the sense amplifiers SA in the respective columns detect data stored in the memory cells MC connected to the word line WL2 via the bit lines BL0, BL2, BL4, BL6, and the like. Further, at a time t3, the sense amplifiers SA in the respective columns detect data stored in the memory cells MC connected to the word line WL3 via the bit lines BL0, BL2, BL4, BL6, and the like. Thereafter, the sense amplifiers SA detect data stored in the memory cells MC connected to the word lines WL4, WL5, and the like in a sequential manner.

By appropriately and selectively driving the word lines WLi, it is possible to read data stored in the arbitrary memory cell MC among the memory cells MC0 to MC5 adjacent in the column direction via the same paired bit lines BL0 and BL1.

While the data read operation has been described above, the data write operation can be performed by carrying a write current to the memory cells MC in the direction according to write data as described with reference to FIG. 2.

(Layout)

Figure 4:
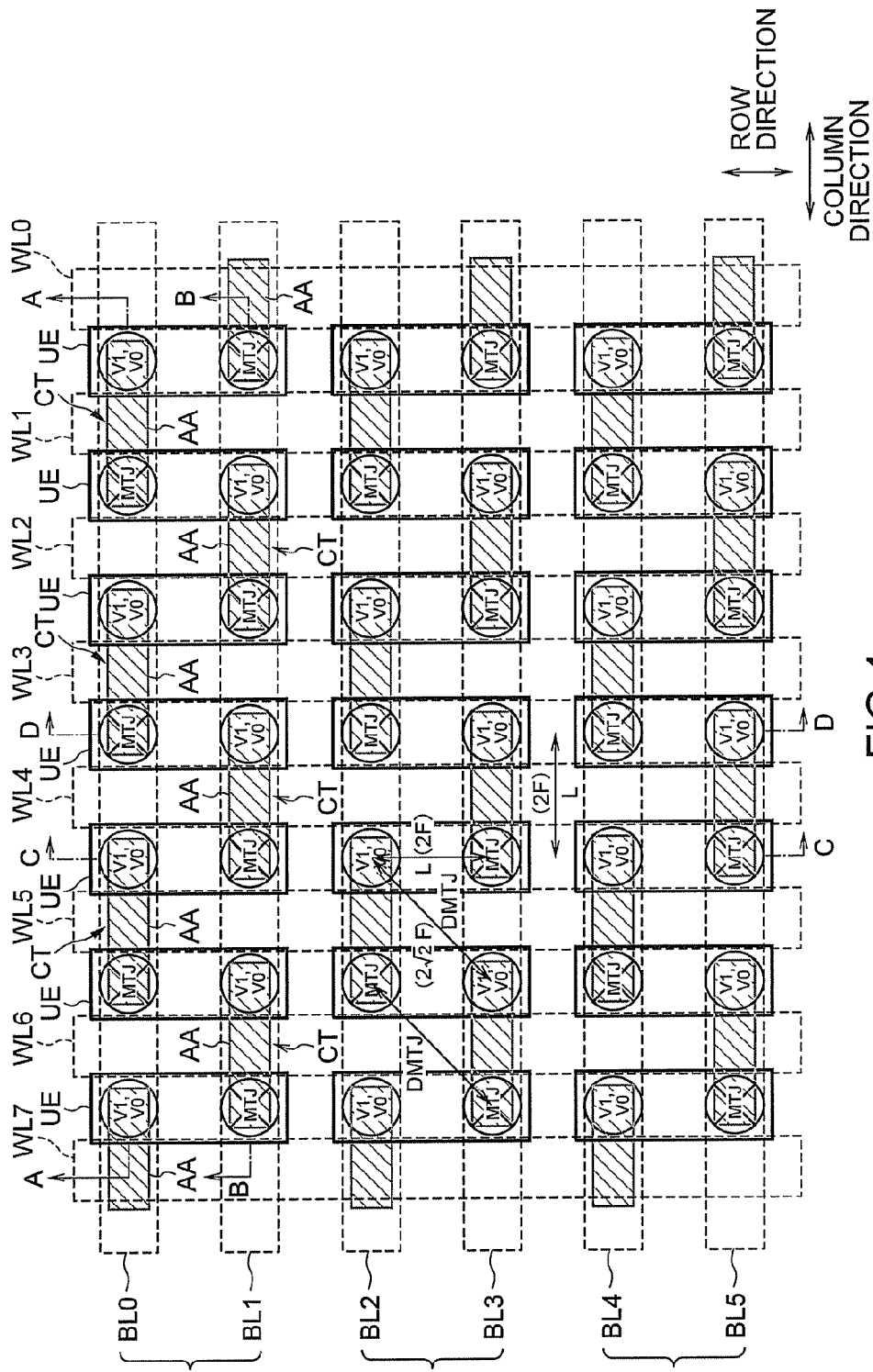
FIG. 4 is a plan view showing a layout of the memory cell array MCA according to the first embodiment.
Figure 6A:
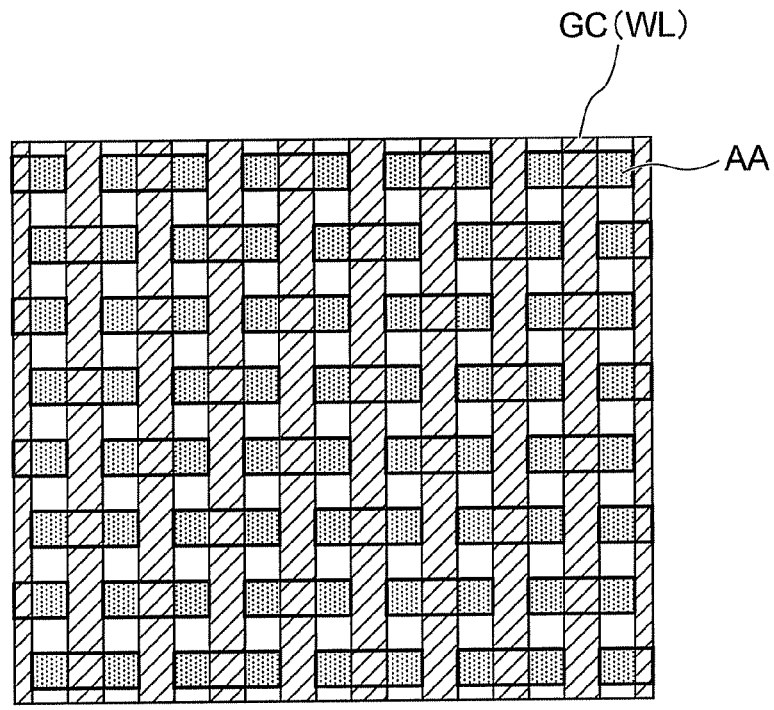
FIGS. 6A and 6B are plan views showing a layout of the active areas AA and gate electrodes GC and a plan view showing a layout of upper electrodes UE and via contacts V0.
Figure 6B:
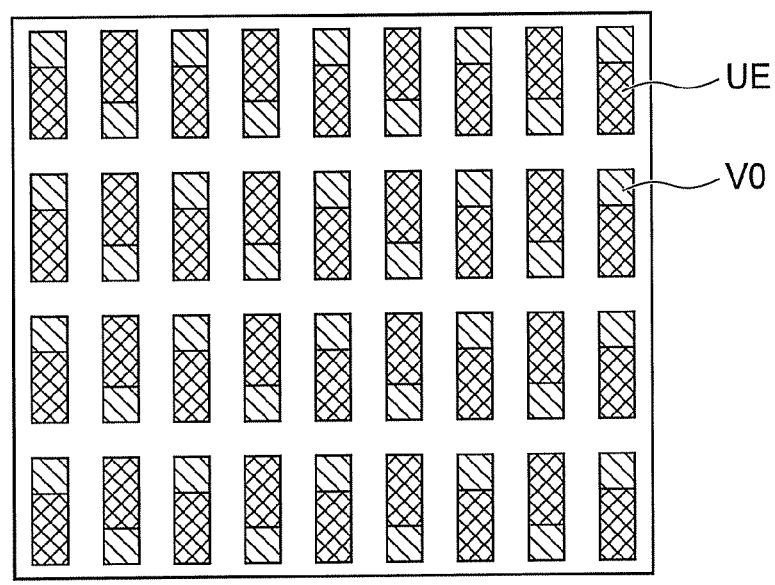
Figure 7A:
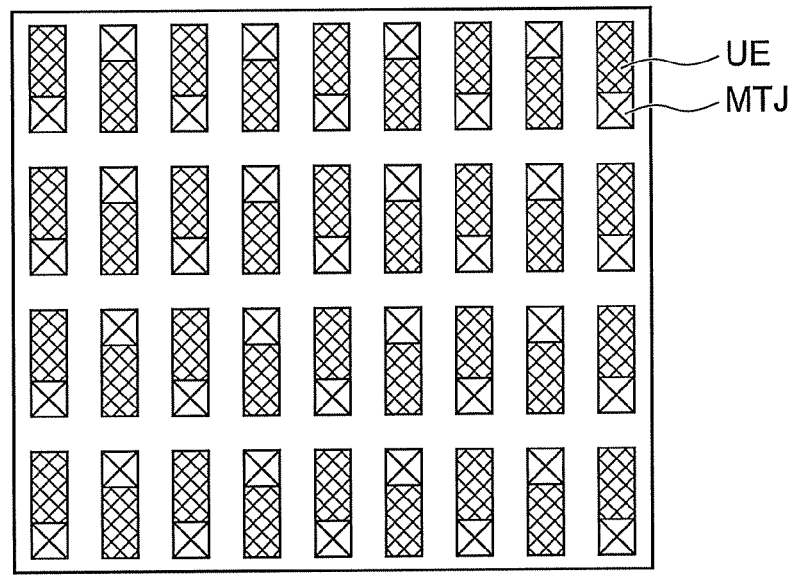
FIGS. 7A and 7B are plan views showing a layout of the MTJ elements and the upper electrodes UE and a layout of the upper electrodes UE, via contacts V1, and the bit lines BL.
Figure 7B:
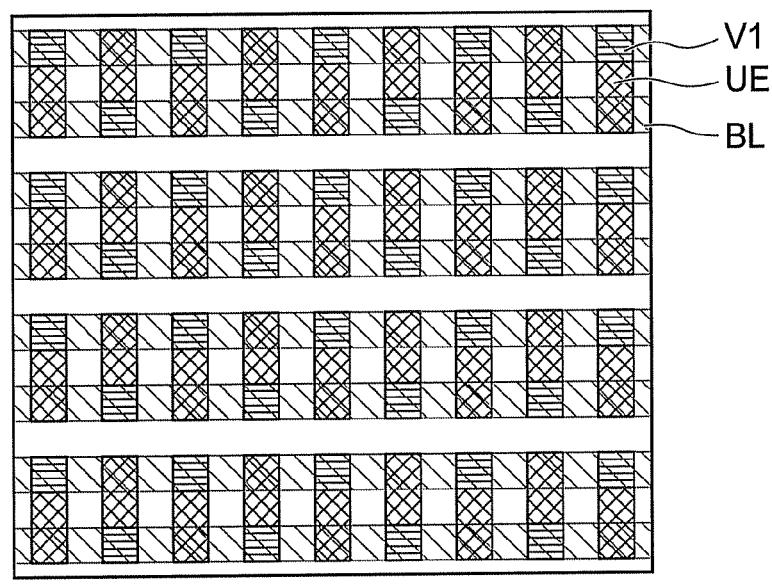

FIG. 4 is a plan view showing a layout of the memory cell array MCA according to the first embodiment. FIGS. 5A to 5D are cross-sectional views taken along lines A-A, B-B, C-C, and D-D of FIG. 4, respectively. FIG. 6A is a plan view showing a layout of the active areas AA and gate electrodes GC (word lines WL), and FIG. 6B is a plan view showing a layout of upper electrodes UE and via contacts V0. FIG. 7A is a plan view showing a layout of the MTJ elements and the upper electrodes UE, and FIG. 7B is a plan view showing a layout of the upper electrodes UE, via contacts V1, and the bit lines BL. Although FIGS. 6A to 7B do not show contact plugs CB0 and CB1, FIGS. 5A to 5D show that the contact plugs CB0 and CB1 are arranged in lower portions of both the via contacts V0 and the MTJ elements.

With reference to FIG. 4, the memory cells MC connected to paired bit lines BL2 and BL3 and those to paired bit lines BL4 and BL5 are the same in configurations as the memory cells MC connected to the paired bit lines BL0 and BL1. That is, the configuration of the memory cells MC connected to the paired bit lines BL0 and BL1 is repeatedly formed in the row direction. Therefore, the configuration of the memory cells MC connected to the paired bit lines BL0 and BL1 is described and those of the memory cells MC connected to the other pairs of bit lines BL are not described herein.

A plurality of active areas AA are isolated from one another by STI (Shallow Trench Isolation) to correspond to the memory cells MC on a semiconductor substrate 10. That is, diffusion layers (source and drain) of the cell transistor CT are provided individually for every memory cell MC and not shared with the cell transistors CT of the adjacent memory cells MC. The active areas AA are arranged in the column direction serving as the first direction and constitute active area strings in respective columns. In the two active area strings adjacent in the row direction serving as the second direction and substantially orthogonal to the column direction, the active areas AA are arranged in a half-pitch-staggered (or a half-pitch-shifted) shape in the column direction (see FIG. 6A). In other words, the active areas AA are arranged in a half-pitch-staggered shape to correspond to the respective bit lines BLi because the active area strings correspond to the bit lines BLi, respectively. This can be understood from the comparison of FIG. 5A with FIG. 5B. In this manner, in the plan layout, the active areas AA are arranged in a staggered shape.

Figure 5A:
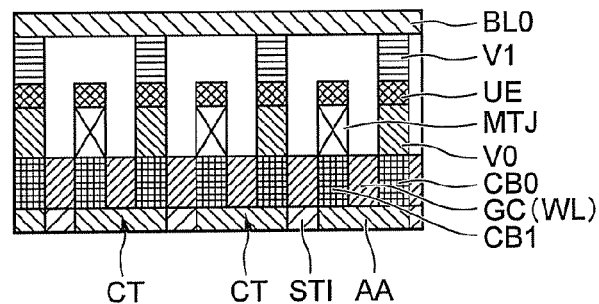
FIGS. 5A to 5D are cross-sectional views taken along lines A-A, B-B, C-C, and D-D of FIG. 4, respectively.
Figure 5B:
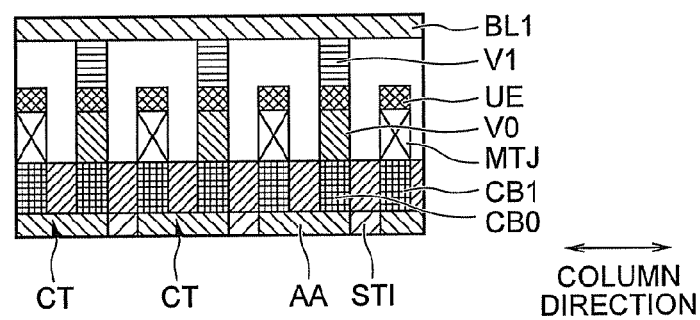

As shown in FIGS. 5A and 5B, one cell transistor CT is formed in each of the active areas AA. The cell transistor CT includes the gate electrode GC and diffusion layers 20 and 21 formed on both sides of a channel under the gate electrode GC. One of the diffusion layers 20 and 21 of the cell transistor CT, that is, the diffusion layer 21 is connected to a lower end of the MTJ element via the contact plug CB1.

Figure 5C:
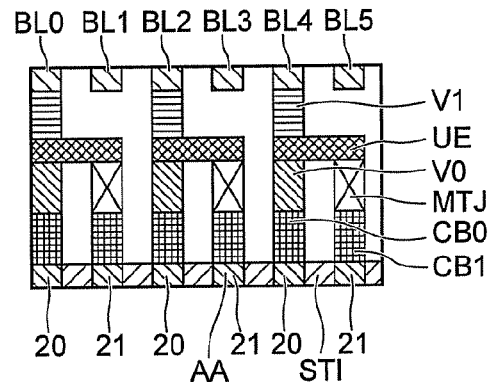
Figure 5D:
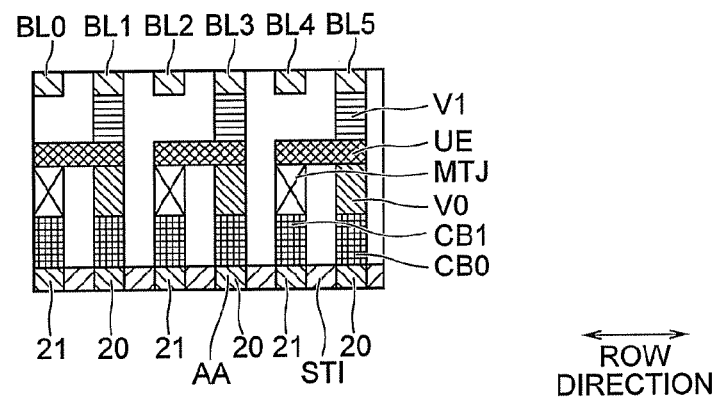

As shown in FIGS. 4, 5C, and 5D, the upper electrodes UE each having one end connected to an upper end of the MTJ element extend in the row direction. As shown in FIG. 5C, for example, the other end of the upper electrode UE having one end connected to the MTJ element provided below the bit line BL1 is connected to the diffusion layer 20 of the cell transistor CT provided below the bit line BL0 adjacent to the bit line BL1 via the via contact V0 and the contact plug CB0. As shown in FIG. 5D, the other end of the upper electrode UE having one end connected to the MTJ element provided below the bit line BL0 is connected to the diffusion layer 20 of the cell transistor CT provided below the bit line BL1 adjacent to the bit line BL0 via the via contact V0 and the contact plug CB0. Furthermore, as shown in FIGS. 5C, 5D, and 7B, the other end of the upper electrode UE having one end connected to the MTJ element provided below the bit line BL0 is connected to the bit line BL1 via the via contact V1 provided on the upper electrode UE.

As shown in FIGS. 4 and 5A to 5D, the active areas AA are half-pitch-staggered for every bit line BLi. Therefore, although the upper electrodes UE are not staggered in the row direction, each of the upper electrodes UE can electrically connect the upper end of the MTJ element present below the bit line BL0 to the bit line BL1 adjacent to the bit line BL0 and to the diffusion layer 20 of the cell transistor CT present below the bit line BL1.

As shown in FIGS. 4 and 6A, each of the active areas AA has a shape extending in the column direction (a shape of a rectangle or an ellipse). As shown in FIGS. 6B and 7A, each of the upper electrodes UE has a shape extending in the row direction (a shape of a rectangle or an ellipse). As viewed from above a surface of the semiconductor substrate 10, the active areas AA and the upper electrodes UE are alternately and continuously arranged so that one end of each of the active areas AA or the upper electrode UE overlaps with the other end of the upper electrode UE or the active area AA. These overlapping portions correspond to the portions indicated by MTJ, V0, and V1 in FIG. 4. Moreover, in the first embodiment, ends of the upper electrodes UE adjacent in the column direction are arranged not in a staggered shape but uniformly in the row direction as shown in FIGS. 6B and 7A. Therefore, as viewed from above the surface of the semiconductor substrate 10, a plurality of active areas AA and a plurality of upper electrodes UE corresponding to the paired bit lines BL0 and BL1 appear to be arranged to be of a rectangular wave shape continuous in the row direction. The configuration of the memory cell array MCA according to the first embodiment is hereinafter also referred to as "rectangular wave configuration".

The layout described above can realize an equivalent circuit to the memory cell array MCA as shown in FIG. 1.

While the example in which the bit lines BL and the word lines WL are arranged at the same pitch has been described above, the pitch of the bit lines BL can be set different from that of the word lines WL.

In the first embodiment, the active areas AA, the memory cells MC, the MTJ elements, the cell transistors CT, and the via contacts V0 and V1 are arranged in a staggered shape on the surface of the semiconductor substrate 10. The constituent elements including the MTJ elements are thereby arranged uniformly on the surface of the semiconductor substrate 10. Similarly, in cut portions of the active areas AA adjacent in the column direction, the constituent elements including the MTJ elements are also arranged in a staggered shape.

Furthermore, the two most adjacent MTJ elements are arranged obliquely (almost at 45 degrees) with respect to the row and column directions so as to correspond to the different bit lines BL and different word lines WL, respectively. For example, when the layout pitch of the bit lines BL is equal to that of the word lines WL, the layout angle between the most adjacent MTJ elements is 45 degrees. Therefore, a layout pitch $D_{MTJ}$ of the two adjacent MTJ elements can be set to $\sqrt{2}\times L$, where L is a layout pitch (Line and Space pitch) of the bit lines BL (the word lines WL). Providing that L is 2F, where F=Minimum Feature Size, the layout pitch $D_{MTJ}$ can be relaxed (widen) to $\sqrt{2}$ times as large as L or 2F, that is, $\sqrt{2}\times L$ or $2\sqrt{2}\times F$. This can facilitate performing lithographic and shape processes on the MTJ elements in the manufacturing of the MRAM according to the first embodiment. Similarly, the two most adjacent via contacts V0 (or V1) are arranged obliquely (almost at 45 degrees) with respect to the row and column directions so as to correspond to the different bit lines BL and different word lines WL, respectively. Therefore, similarly to the MTJ elements, the layout pitch of the two adjacent via contacts V0 (or V1) can be set to $\sqrt{2}\times L$. This can facilitate performing lithographic and shape processes on the via contacts V0 (or V1) in the manufacturing of the MRAM according to the first embodiment. As a result, the MRAM can be further downscaled and the storage capacity of the MRAM can be further increased accordingly.

In the first embodiment, as shown in FIGS. 5A to 5D, the via contacts V1 serving as first upper contacts are not formed above the MTJ elements but provided above the via contacts V0 serving as lower contacts via the upper electrodes UE. This can protect the MJT elements from process damage during the formation of the via contacts V1.

(Modification of First Embodiment)

Figure 8:
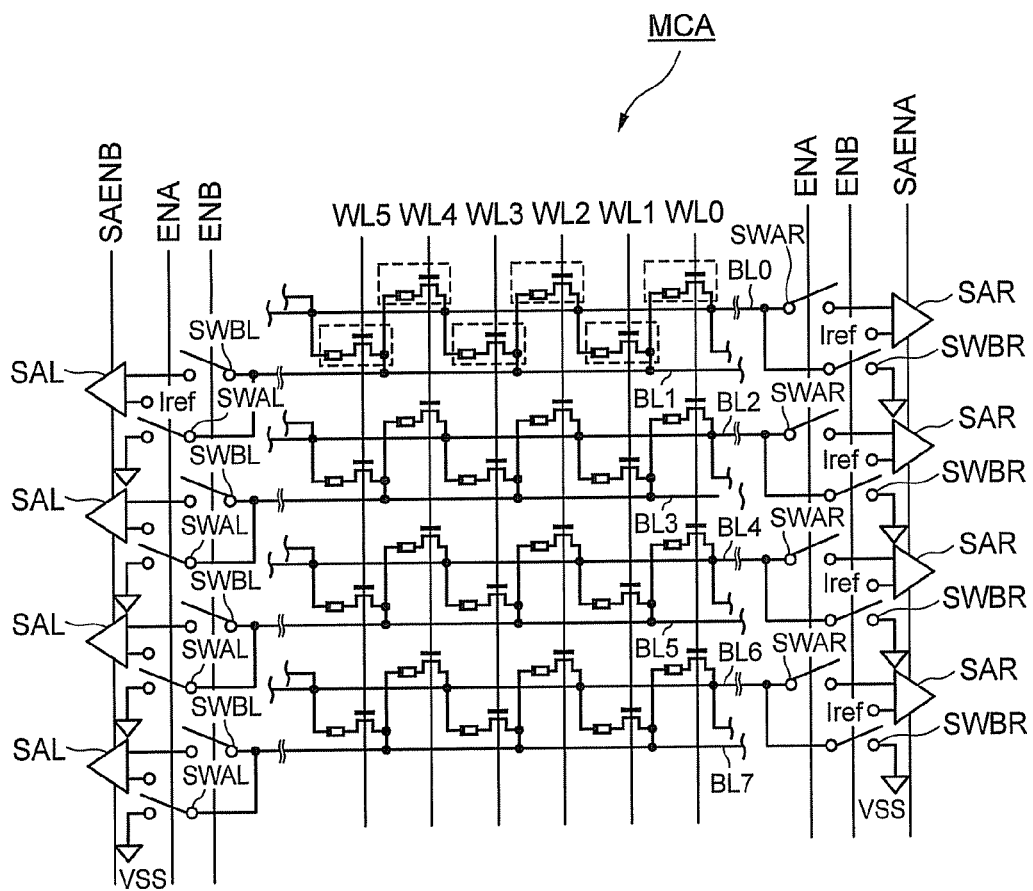
FIG. 8 is a schematic diagram showing a configuration example of the memory cell array MCA in an MRAM according to a modification of the first embodiment.

FIG. 8 is a schematic diagram showing a configuration example of the memory cell array MCA in an MRAM according to a modification of the first embodiment. In the first embodiment, the cell currents Icell flowing to the MTJ elements MC of the two memory cells MCi and MCi+1 adjacent in the row direction at the time of a data read operation are opposite in the current flow direction (A1 and A2 shown in FIG. 2). In the MRAM according to the present modification, the cell currents Icell flowing to the MTJ elements of a plurality of memory cells MC at the time of a data read operation are identical in the current flow direction (only A1 or A2 shown in FIG. 2). Therefore, in the present modification, the sense amplifiers SA are provided to correspond to each of the bit lines BLi on both sides of the memory cell array MCA, respectively. The sense amplifiers SA provided on the left side of the memory cell array MCA are denoted by SAL and those on the right side are denoted by SAR in the present modification.

Furthermore, switching elements SWAL, SWBL, SWAR, and SWAL are provided to switch over the connections between the sense amplifiers SAL and SAR and the reference potential VSS. The memory cell array MCA according to the present modification can be configured similarly (rectangular wave configuration) to that according to the first embodiment.

The switching elements SWAL are provided between the bit lines BL1, BL3, BL5, and BL7 and the reference potential VSS, respectively. The switching elements SWBL are provided between the bit lines BL1, BL3, BL5, and BL7 and the sense amplifiers SAL, respectively. The switching elements SWAR are provided between the bit lines BL0, BL2, BL4, and BL6 and the sense amplifiers SAR, respectively. The switching elements SWBR are provided between the bit lines BL0, BL2, BL4, and BL6 and the reference potential VSS, respectively.

Figure 9:
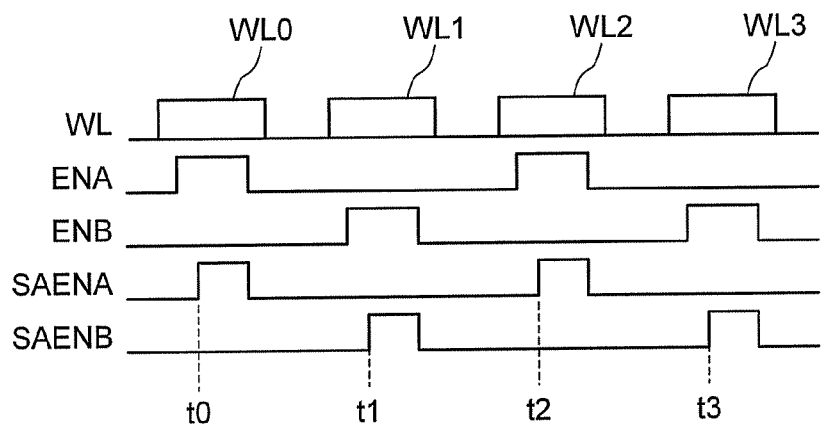
FIG. 9 is a timing diagram showing an operation example of the word lines WLi, sense-amplifier enable signals SAENA and SAENB, and switch enable signals ENA and ENB at the time of a data read operation.

FIG. 9 is a timing diagram showing an operation example of the word lines WLi, sense-amplifier enable signals SAENA and SAENB, and switch enable signals ENA and ENB at the time of a data read operation.

For example, the word lines WL0 to WL3 are activated in this order. The switch enable signal ENA and the sense-amplifier enable signal SAENA are activated at the timing of the activation of the word lines WL0 and WL2. The switch enable signal ENB and the sense-amplifier enable signal SAENB are activated at the timing of the activation of the word lines WL1 and WL3.

At t0 and t2, the switch enable signal ENA is activated, whereby the bit lines BL0, BL2, BL4, and BL6 are connected to the sense amplifiers SAR, respectively and the bit lines BL1, BL3, BL5 and BL7 are connected to the reference potential VSS. The sense amplifiers SAR operates in response to the activation of the sense-amplifier enable signal SANEA. The cell current Icell thereby flows to the memory cells MC connected to the word lines WL0 and WL2. The current flow direction of the cell current Icell is A2 shown in FIG. 2.

At t1 and t3, the switch enable signal ENB is activated, whereby the bit lines BL1, BL3, BL5, and BL7 are connected to the sense amplifiers SAL, respectively and the bit lines BL0, BL2, BL4 and BL6 are connected to the reference potential VSS. The sense amplifiers SAL operates in response to the activation of the sense-amplifier enable signal SANEB. The cell current Icell thereby flows to the memory cells MC connected to the word lines WL1 and WL3. The current flow direction of the cell current Icell is A2 shown in FIG. 2 similarly to that at t0 and t2.

In this manner, the cell current Icell flows to the memory cells MC in the same direction, which eliminates variations in the channel resistances of the cell transistors CT due to, for example, the substrate bias effect. This can increase a read margin (signal difference between "1" and "0").

Because the sense amplifiers SAL and SAR are provided to correspond to the respective bit lines BL, the number of arranged sense amplifiers SAL and SAR, that is, the area by which the sense amplifiers SAL and SAR are formed is larger than that according to the first embodiment. However, because the configuration of the memory cell array MCA according to the present modification is identical to that of the memory cell array MCA according to the first embodiment, this modification can achieve other effects of the first embodiment.

Second Embodiment

Figure 10:
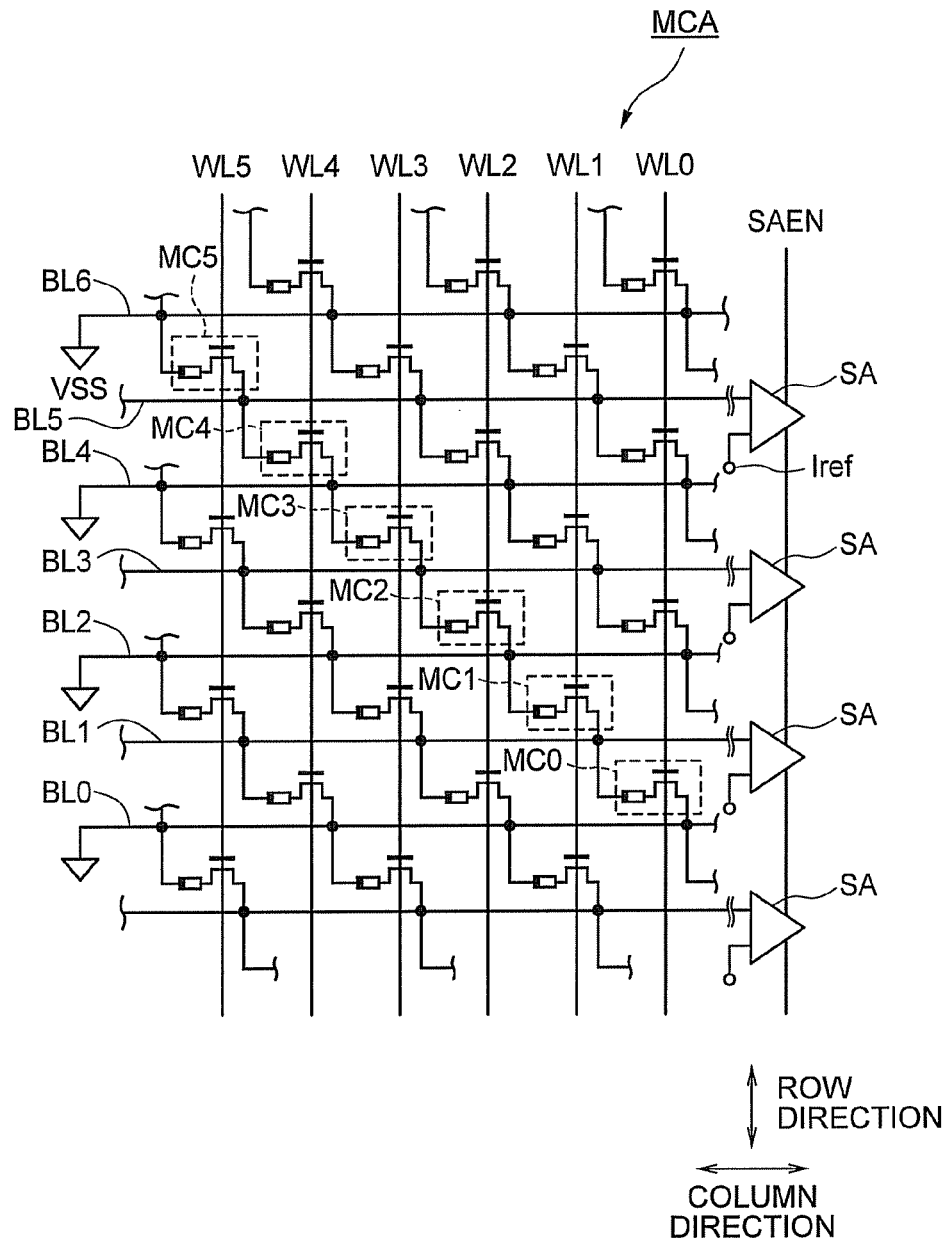
FIG. 10 is a schematic diagram showing a configuration example of the memory cell array MCA in an MRAM according to a second embodiment.
Figure 11:
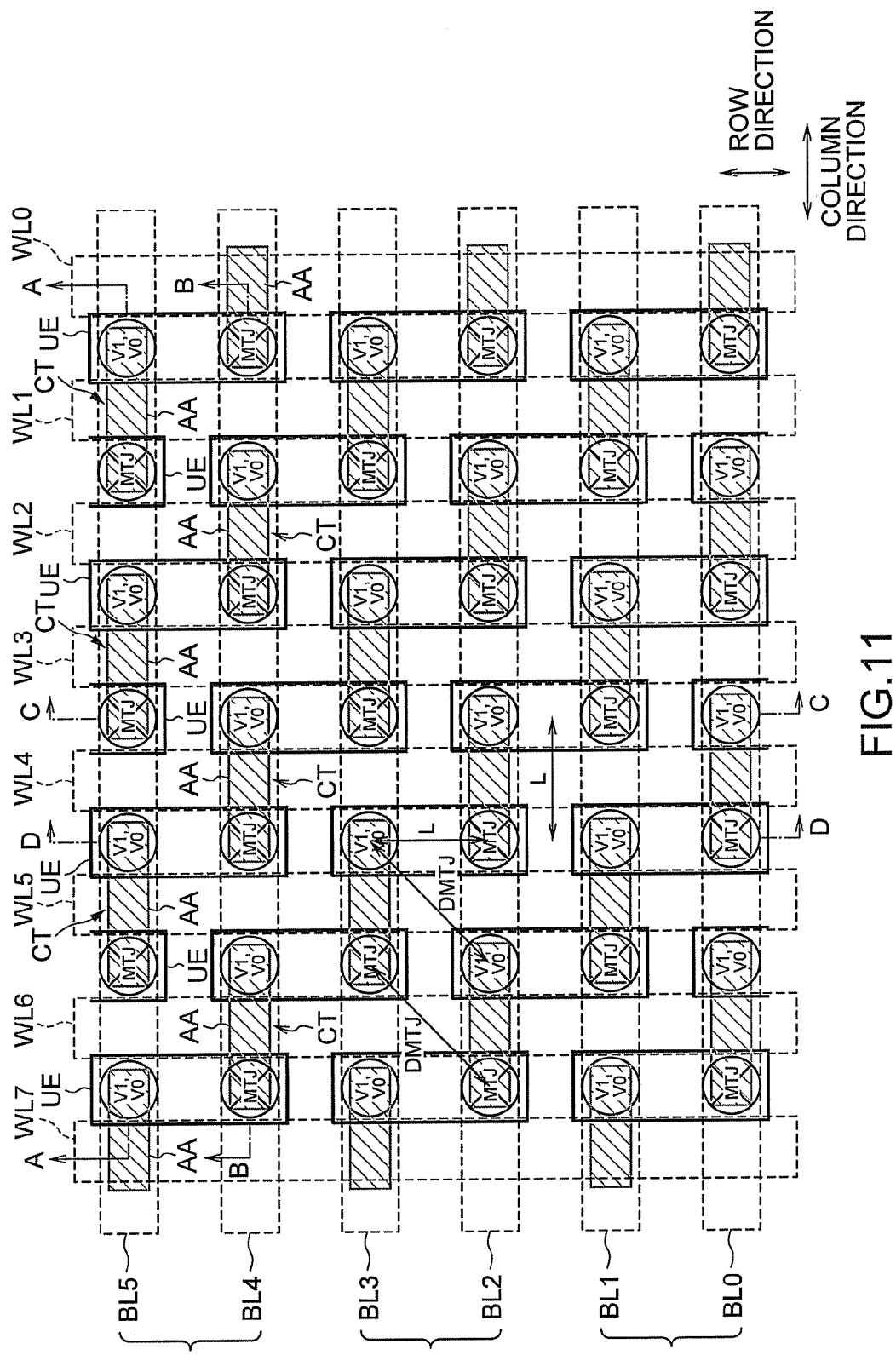
FIG. 11 is a plan view showing a layout of the memory cell array MCA according to the second embodiment.

FIG. 10 is a schematic diagram showing a configuration example of the memory cell array MCA in an MRAM according to a second embodiment. The second embodiment differs from the first embodiment in the arrangement of the memory cells MC. In the first embodiment, as viewed from above the surface of the semiconductor substrate 10, the active areas AA and the upper electrodes UE appear to be arranged to be of the rectangular wave shape continuous in the row direction as shown in FIG. 4. In the second embodiment, by contrast, as viewed from above the surface of the semiconductor substrate 10, the upper electrodes UE appear to be arranged to be of a staircase shape continuous in an oblique direction with respect to the row and column directions as shown in FIG. 11. The configuration of the memory cell array MCA according to the second embodiment is also referred to as "staircase configuration".

The second embodiment is identical to the first embodiment in the arrangement of the bit lines BLi and the word lines WLi and the configuration of each memory cell MC. Although the arrangement of the bit lines BLi is the same, the bit lines BL0 to BL6 according to the second embodiment are denoted differently from the first embodiment for the sake of convenience.

More specifically, the MTJ element of the first memory cell MC0 among a plurality of memory cells MCi is connected to one end (drain or source) of the cell transistor CT of the second memory cell MC1 adjacent to the first memory cell MC0. The MTJ element of the second memory cell MC1 is connected to one end of the cell transistor CT of the third memory cell MC2 further adjacent to the first memory cell MC0. That is, the MTJ element of one memory cell MCi is connected to one end of the cell transistor CT of the memory cell MCi+1 further adjacent to the memory cell MCi.

Furthermore, in the second embodiment, the first memory cell MC0 is connected between the first bit line BL0 and the second bit line BL1 adjacent to the first bit line BL0. The second memory cell MC1 is connected between the second bit line BL1 and the third bit line BL2 adjacent to the second bit line BL1. The third memory cell MC2 is connected between the third bit line BL2 and the fourth bit line BL3 adjacent to the third bit line BL2. That is, one memory cell MC1 is connected between the bit line BLi and the bit line BLi+1 adjacent to the bit line BLi.

As described above, in the second embodiment, when the bit lines BLi are arranged in parallel to the bit lines BLi+1 adjacent to the bit lines BLi, the MTJ elements and the cell transistors CT of the memory cells MC1 are alternately connected in series. That is, when the bit lines BLi are arranged in parallel to the adjacent bit lines BLi+1, the MTJ elements and the cell transistors CT are alternately connected in series in the order of, for example, CT, MTJ, CT, MTJ, and the like. In this manner, the memory cells MC1 connected in series are connected between different pairs of bit lines BLi and BLi+1, and connected to the different word lines WLi, respectively.

The MRAM according to the second embodiment can be configured similarly to that according to the first embodiment in other aspects. Therefore, each of the sense amplifiers SA detects currents flowing to the memory cells MC in two directions. In this case, it suffices to connect each of the sense amplifiers SA to one of the pair bit lines BLi and BLi+1. This can make the connection arrangement between the sense amplifiers SA and the bit lines BL simpler. It also suffices to provide the sense amplifiers SA for every pair of bit lines BLi and BLi+1. This can decrease the number of the sense amplifiers SA.

The same timing diagram as that shown in FIG. 3 can be used as that showing the voltages of the word lines WLi and that of the sense-amplifier enable signal SAEN at the time of the data read operation.

Therefore, at a time t0, the sense amplifiers SA in the respective columns detect data stored in the memory cells MC connected to the word line WL0 via the bit lines BL1, BL3, BL5, and the like. At this time, the paired bit lines BL connected to the both sides of the read-target memory cells MC are (BL0, BL1), (BL2, BL3), (BL4, BL5), and the like. At a time t1, the sense amplifiers SA in the respective columns detect data stored in the memory cells MC connected to the word line WL1 via the bit lines BL1, BL3, BL5, and the like. At this time, the paired bit lines BL connected to the both sides of the read-target memory cells MC are (BL1, BL2), (BL3, BL4), (BL5, BL6), and the like. At a time t2, the sense amplifiers SA in the respective columns detect data stored in the memory cells MC connected to the word line WL2 via the bit lines BL1, BL3, BL5, and the like. At this time, the paired bit lines BL connected to the both sides of the read-target memory cells MC are (BL0, BL1), (BL2, BL3), (BL4, BL5), and the like. At a time t3, the sense amplifiers SA in the respective columns detect data stored in the memory cells MC connected to the word line WL3 via the bit lines BL1, BL3, BL5, and the like. At this time, the paired bit lines BL connected to the both sides of the read-target memory cells MC are (BL1, BL2), (BL3, BL4), (BL5, BL6), and the like. When the sense amplifiers SA detect data stored in the memory cells MC connected to the word lines WL4, WL5, and the like, the paired bit lines BL are alternately changed between (BL0, BL1), (BL2, BL3), (BL4, BL5), and the like and (BL1, BL2), (BL3, BL4), (BL5, BL6), and the like, similarly to the above.

For example, when the data is read from or written to the memory cell MC0, the word line WL0 is activated. The sense amplifier SA reads the data from the memory cell MC0 via the paired bit lines BL0 and BL1 or carries a write current to the memory cell MC0 in the direction according to the write data via the paired bit lines BL0 and BL1.

When the data is read from the memory cell MC1, the word line WL1 is activated. The sense amplifier SA reads the data from the memory cell MC1 via the paired bit lines BL1 and BL2.

When the data is read from the memory cell MC2, the word line WL2 is activated. The sense amplifier SA reads the data from the memory cell MC2 via the paired bit lines BL2 and BL3.

As described above, in the MRAM according to the second embodiment, by appropriately and selectively driving the word lines WLi, it is possible to read data stored in the arbitrary memory cell MC among the memory cells MC0 to MC5 connected in series. At this time, the data read from the memory cells MC0 to MC5 is transmitted to the sense amplifiers SA via the corresponding paired bit lines BL0 and BL1, BL1 and BL2, BL2 and BL3, BL3 and BL4, BL4 and BL5, and BL5 and BL6, respectively. Moreover, in the MRAM according to the second embodiment, by appropriately and selectively driving the word lines WLi, it is possible to write data to the arbitrary memory cell MC among the memory cells MC0 to MC5. At this time, the data is written to the memory cells MC0 to MC5 via the corresponding paired bit lines BL0 and BL1, BL1 and BL2, BL2 and BL3, BL3 and BL4, BL4 and BL5, and BL5 and BL6, respectively.

(Layout)

Figure 12A:
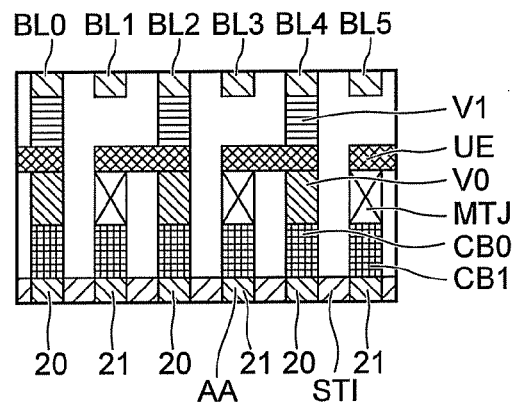
FIGS. 12A and 12B are cross-sectional views taken along lines C-C and D-D of FIG. 11.
Figure 12B:
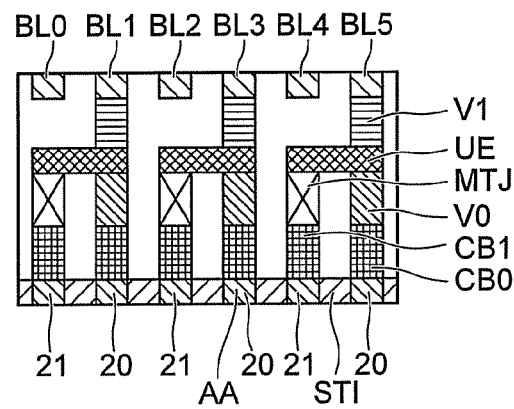
Figure 13A:
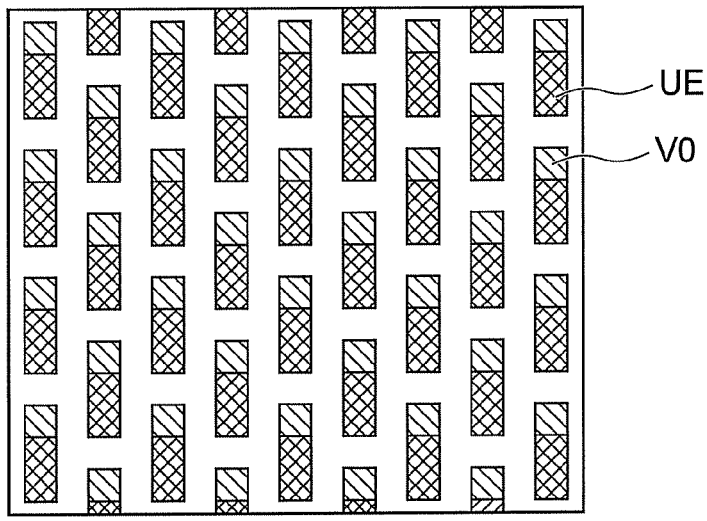
FIGS. 13A to 13c are plan views showing a layout of the upper electrodes UE and the via contacts V0, a layout of the MTJ elements and the upper electrodes UE, and a layout of the upper electrodes UE, the via contacts V1 and the bit lines BL.
Figure 13B:
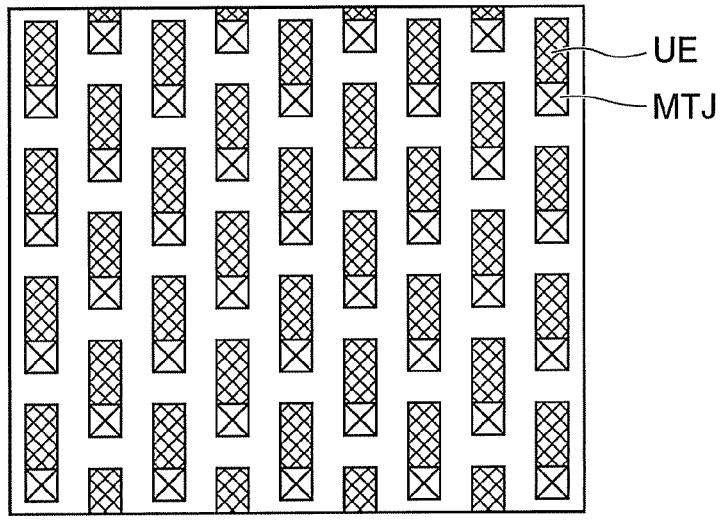
Figure 13C:
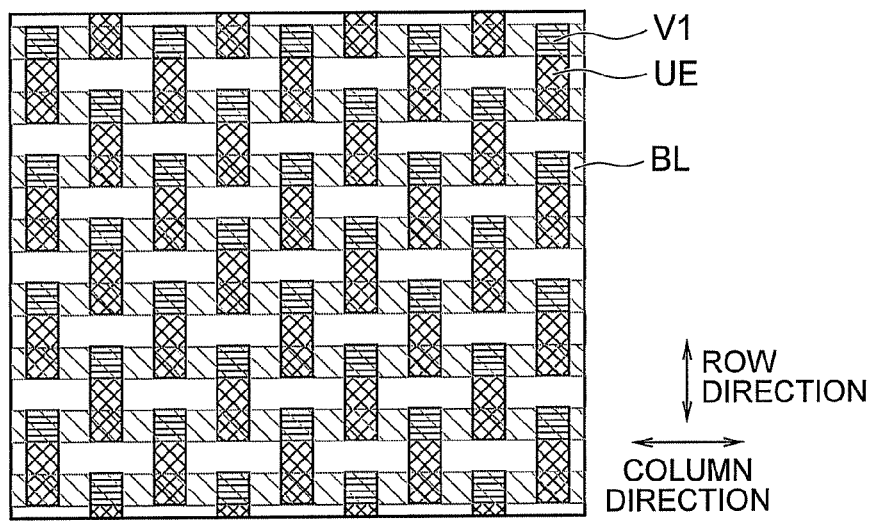

FIG. 11 is a plan view showing a layout of the memory cell array MCA according to the second embodiment. FIGS. 12A and 12B are cross-sectional views taken along lines C-C and D-D of FIG. 11, respectively. Cross-sectional views taken along lines A-A and B-B of FIG. 11 are not shown herein because these are substantially identical to FIGS. 5A and 5B, respectively. FIG. 13A is a plan view showing a layout of the upper electrodes UE and the via contacts V0. FIG. 13B is a plan view showing a layout of the MTJ elements and the upper electrodes UE. FIG. 13C is a plan view showing a layout of the upper electrodes UE, the via contacts V1, and the bit lines BL. The layout view of the active areas AA and the word lines WL is not shown herein because it is substantially identical to FIG. 6A. The contact plugs CB0 and CB1 are identical to those according to the first embodiment.

The second embodiment differs from the first embodiment in that the upper electrodes UE adjacent in the column direction are half-pitch-staggered in the row direction. Layouts of other constituent elements in the second embodiment are identical to those of corresponding elements of the first embodiment.

With reference to FIGS. 13A to 13C, it can be understood that the upper electrodes UE adjacent in the column direction are half-pitch-staggered (half-pitch-shifted) in the row direction. That is, in the plan layout, like the active areas AA, the upper electrodes UE are arranged in a staggered shape. Similarly, in the cut portions of the upper electrodes UE adjacent in the row direction, the upper electrodes UE are arranged in a staggered shape.

As shown in FIGS. 11, 12A, and 12B, the upper electrodes UE each having one end connected to the upper end of the MTJ element extend in the row direction. For example, as shown in FIG. 12A, the other end of the upper electrode UE having one end connected to the MTJ element provided below the bit line BL1 is connected to the diffusion layer 20 of the cell transistor CT provided below the bit line BL2 adjacent to the bit line BL1 via the via contact V0 and the contact plug CB0. As shown in FIG. 12B, the other end of the upper electrode UE having one end connected to the MTJ element provided below the bit line BL0 is connected to the diffusion layer 20 of the cell transistor CT provided below the bit line BL1 adjacent to the bit line BL0 via the via contact V0 and the contact plug CB0. Furthermore, the other end of the upper electrode UE is connected to the bit line BL1 via the via contact V1 provided on the upper electrode UE as shown in FIGS. 12A and 12B.

As shown in FIGS. 11, 12A, and 12B, the active areas AA adjacent in the row direction are half-pitch-staggered in the column direction, and the upper electrode UE adjacent in the column direction are half-pitch-staggered in the row direction. As shown in FIG. 11, each of the active areas AA has a shape extending in the column direction (the shape of the rectangle or ellipse). Each of the upper electrodes UE has a shape extending in the row direction (the shape of the rectangle or ellipse). As viewed from above the surface of the semiconductor substrate 10, the active areas AA and the upper electrodes UE are alternately and continuously arranged so that one end of each of the active areas AA or upper electrode UE overlaps with the other end of the upper electrode UE or the active area AA. These overlapping portions correspond to the portions indicated by MTJ, V0, and V1 in FIG. 11. Therefore, as viewed from above the surface of the semiconductor substrate 10, a plurality of active areas AA and a plurality of upper electrodes UE appear to be arranged to be of a staircase shape continuous in the oblique direction at about 45 degrees with respect to the row and column directions.

The layout described above can realize an equivalent circuit to the memory cell array MCA as shown in FIG. 10.

While the example in which the bit lines BL and the word lines WL are arranged at the same pitch has been described above, the pitch of the bit lines BL can be set different from that of the word lines WL.

In the second embodiment, like the first embodiment, the constituent elements including the MTJ elements are arranged uniformly on the surface of the semiconductor substrate 10. The arrangement of the MTJ elements according to the second embodiment is identical to that according to the first embodiment. Therefore, the second embodiment can also achieve effects of the first embodiment.

(Modification of Second Embodiment)

Figure 14:
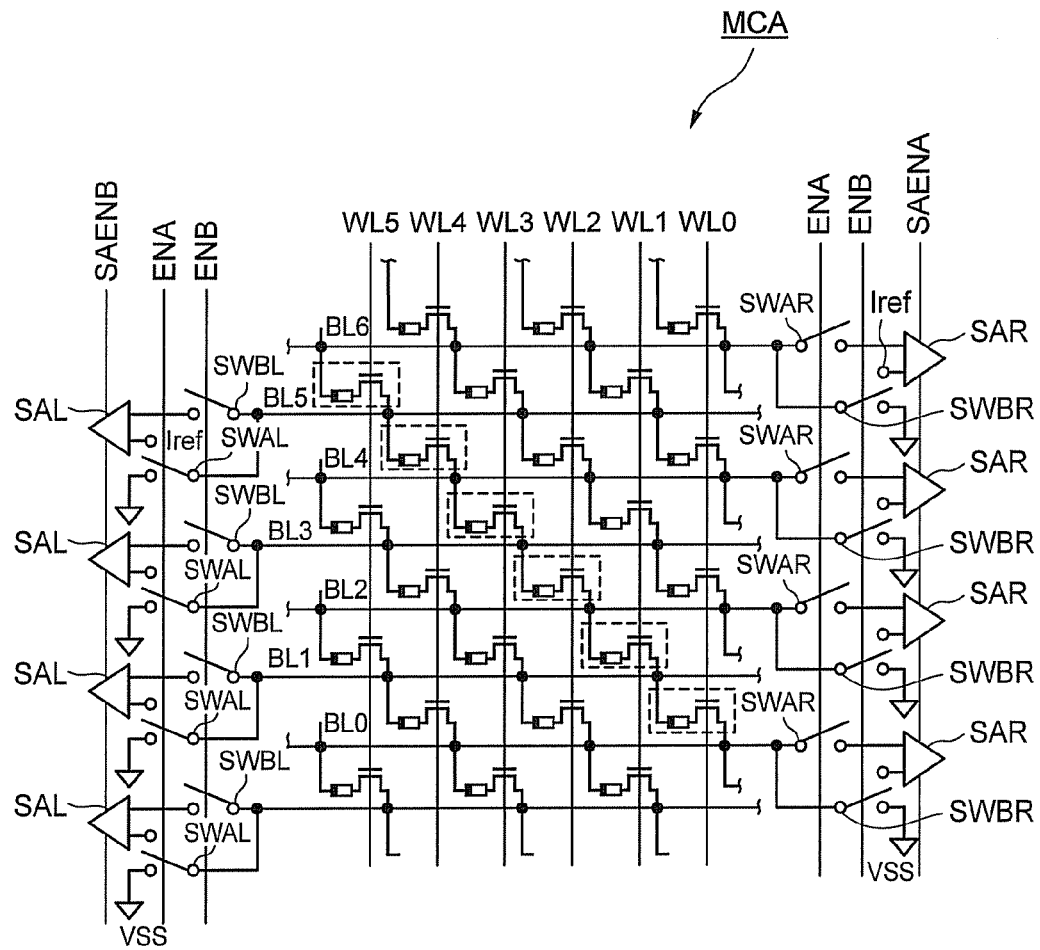
FIG. 14 is a schematic diagram showing a configuration example of the memory cell array MCA in an MRAM according to a modification of the second embodiment
Figure 15A:
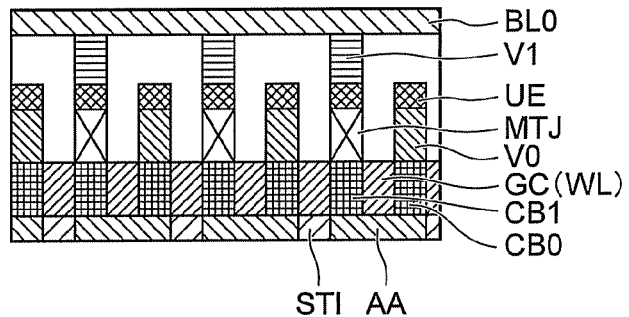
FIGS. 15A to 15D are cross-sectional views of the memory cell array MCA in an MRAM according to a third embodiment.
Figure 15B:
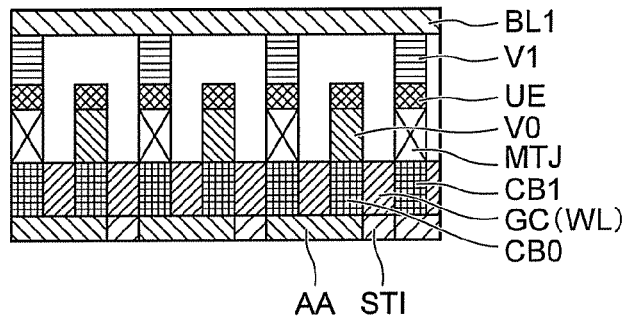
Figure 15C:
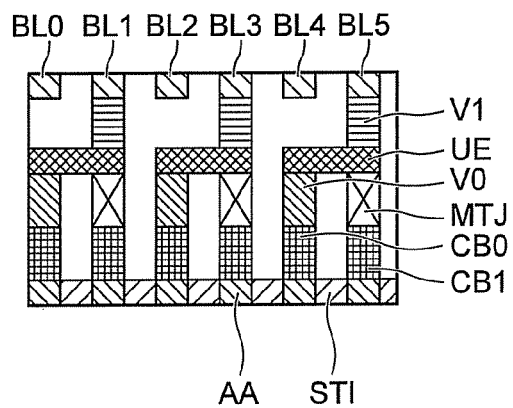
Figure 15D:
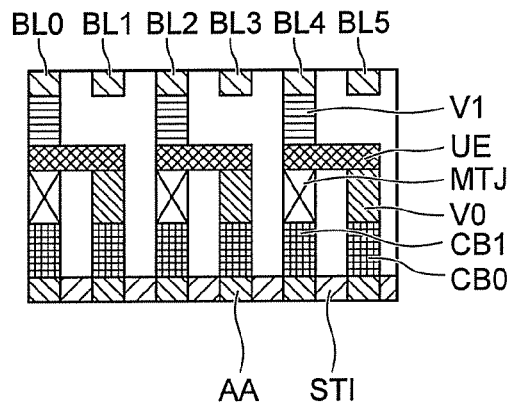

FIG. 14 is a schematic diagram showing a configuration example of the memory cell array MCA in an MRAM according to a modification of the second embodiment. In the present modification, the modification of the first embodiment is applied to the second embodiment.

In the second embodiment, the cell currents Icell flowing to the MTJ elements of the two memory cells MCi and MCi+1 in the adjacent columns at the time of a data read operation are opposite in the current flow direction. In the MRAM according to the present modification, the cell currents Icell flowing to the MTJ elements of a plurality of memory cells MC at the time of a data read operation are identical in the current flow direction. Therefore, in the present modification, the sense amplifiers SA are provided to correspond to each of the bit lines BLi on the both side of the memory cell array MCA, respectively. The sense amplifiers SA provided on the left side of the memory cell array MCA are denoted by SAL and those on the right side are denoted by SAR in the present modification.

Furthermore, the switching elements SWAL, SWBL, SWAR, and SWAL are provided to switch over the connections between the sense amplifiers SAL and SAR and the reference potential VSS. The memory cell array MCA according to the present modification can be configured similarly (staircase configuration) to that according to the second embodiment.

The switching elements SWAL are provided between the bit lines BL1, BL3, and BL5 and the reference potential VSS, respectively. The switching elements SWBL are provided between the bit lines BL1, BL3, and BL5 and the sense amplifiers SAL, respectively. The switching elements SWAR are provided between the bit lines BL0, BL2, BL4, and BL6 and the sense amplifiers SAR, respectively. The switching elements SWBR are provided between the bit lines BL0, BL2, BL4, and BL6 and the reference potential VSS, respectively.

The same timing diagram as that shown in FIG. 9 can be used as that showing operations for the word lines WLi, sense-amplifier enable signals SAENA and SAENB, and switch enable signals ENA and ENB at the time of the data read operation.

For example, at t0 and t2, the switch enable signal ENA is activated, whereby the bit lines BL0, BL2, BL4, and BL6 are connected to the sense amplifiers SAR, respectively and the bit lines BL1, BL3, BL5 and BL7 are connected to the reference potential VSS. The sense amplifiers SAR operates in response to the activation of the sense-amplifier enable signal SANEA. The cell current Icell thereby flows to the memory cells MC connected to the word lines WL0 and WL2. The current flow direction of the cell current Icell is A2 shown in FIG. 2. The paired bit lines BL are (BL0, BL1), (BL2, BL3), (BL4, BL5), and the like.

At t1 and t3, the switch enable signal ENB is activated, whereby the bit lines BL1, BL3, BL5, and BL7 are connected to the sense amplifiers SAL, respectively and the bit lines BL0, BL2, BL4 and BL6 are connected to the reference potential VSS. The sense amplifiers SAL operates in response to the activation of the sense-amplifier enable signal SANEB. The cell current Icell thereby flows to the memory cells MC connected to the word lines WL1 and WL3. The current flow direction of the cell current Icell is A2 shown in FIG. 2 similarly to that at t0 and t2. The paired bit lines BL are (BL1, BL2), (BL3, BL4), (BL5, BL6), and the like.

In this manner, the cell current Icell flows to the memory cells MC in the same direction, which eliminates variations in the channel resistances of the cell transistors CT due to, for example, the substrate bias effect. This can increase a read margin (signal difference between "1" and "0").

Because the sense amplifiers SAL and SAR are provided to correspond to the respective bit lines BL, the number of arranged sense amplifiers SAL and SAR, that is, the area by which the sense amplifiers SAL and SAR are formed is larger than that according to the second embodiment. However, because the configuration of the memory cell array MCA according to the present modification is identical to that of the memory cell array MCA according to the second embodiment, this modification can achieve other effects of the second embodiment.

Third Embodiment

FIGS. 15A to 15D are cross-sectional views of the memory cell array MCA in an MRAM according to a third embodiment. The third embodiment differs from the first embodiment in that the via contacts V1 are provided above the MTJ elements via the upper electrodes UE. The MRAM according to the third embodiment can be configured similarly to that according to the first embodiment in other aspects.

Therefore, FIGS. 15A to 15D correspond to the cross-sectional views taken along the lines A-A, B-B, C-C, and D-D of FIG. 4, respectively. However, the via contacts V1 do not overlap with the via contacts V0 but with the MTJ elements.

An equivalent circuit to the MRAM according to the third embodiment is the same as FIG. 1 even if the via contacts V1 are provided above the MTJ elements. Therefore, the third embodiment can achieve effects identical to those of the first embodiment.

Furthermore, in the third embodiment, the parasitic resistances between the MTJ elements and the bit lines BL can be reduced by as much as the wiring resistances of the upper electrodes UE as compared with the first embodiment because the via contacts V1 are provided above the MTJ elements. The reduction in the parasitic resistances between the MTJ elements and the bit lines BL can improve the read margin because the resistances of the MTJ elements are detected as data in the MRAM according to the third embodiment.

Fourth Embodiment

Figure 16A:
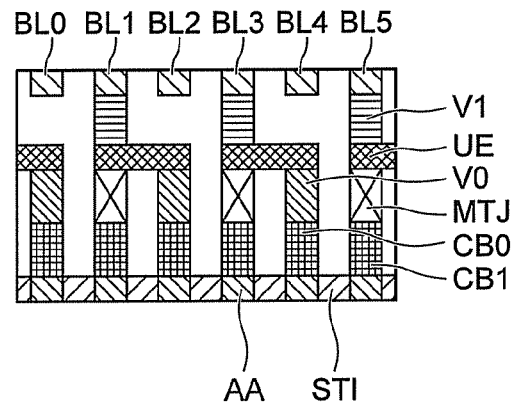
FIGS. 16A and 16B are cross-sectional views of the memory cell array MCA in an MRAM according to a fourth embodiment.
Figure 16B:
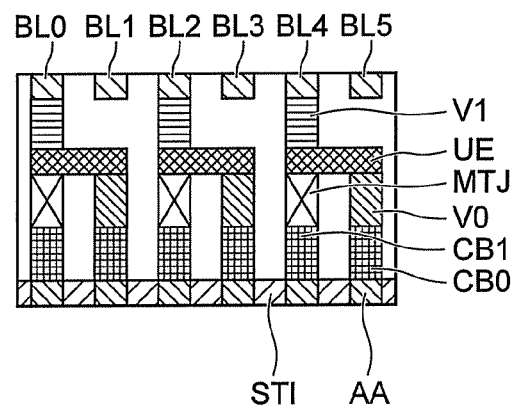

FIGS. 16A and 16B are cross-sectional views of the memory cell array MCA in an MRAM according to a fourth embodiment. The fourth embodiment differs from the second embodiment in that the via contacts V1 are provided above the MTJ elements via the upper electrodes UE. The MRAM according to the fourth embodiment can be configured similarly to that according to the second embodiment in other aspects.

Therefore, FIGS. 16A and 16B correspond to the cross-sectional views taken along the lines C-C and D-D of FIG. 11, respectively. However, the via contacts V1 do not overlap with the via contacts V0 but with the MTJ elements. Cross-sectional views taken along lines A-A and B-B of FIG. 11 are not shown herein because these are identical to FIGS. 15A and 15B, respectively.

An equivalent circuit to the MRAM according to the fourth embodiment is the same as FIG. 10 even if the via contacts V1 are provided above the MTJ elements. Therefore, the fourth embodiment can also achieve effects identical to those of the second embodiment.

Furthermore, in the fourth embodiment, the parasitic resistances between the MTJ elements and the bit lines BL can be reduced by as much as the wiring resistances of the upper electrodes UE as compared with the second embodiment because the via contacts V1 are provided above the MTJ elements. The reduction in the parasitic resistances between the MTJ elements and the bit lines BL can improve the read margin because the resistances of the MTJ elements are detected as data in the MRAM according to the fourth embodiment.

Fifth Embodiment

Figure 17:
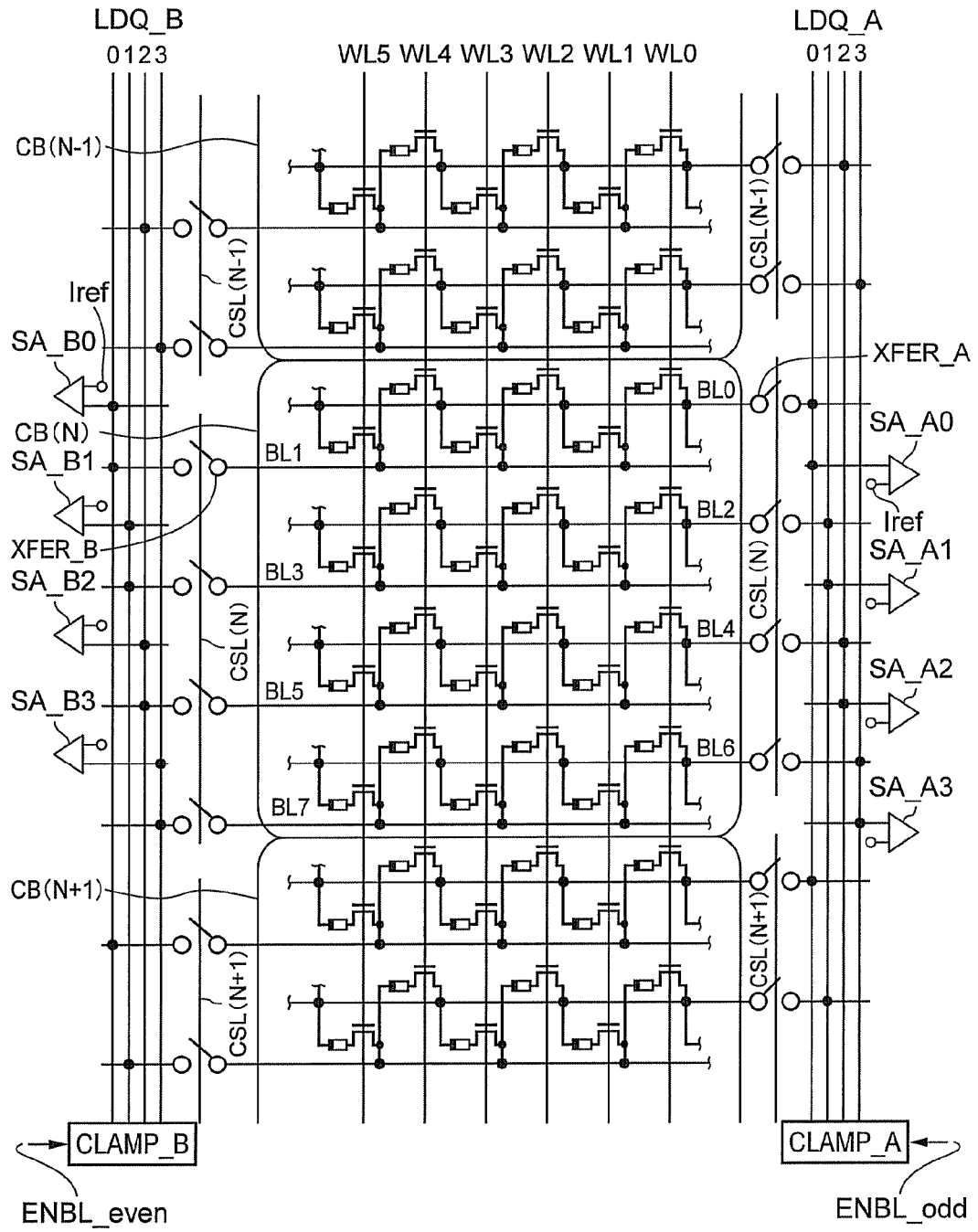
FIG. 17 is a schematic diagram showing a configuration example of the memory cell array MCA, local DQ lines LDQ, and the sense amplifiers SA in an MRAM according to a fifth embodiment.

FIG. 17 is a schematic diagram showing a configuration example of the memory cell array MCA, local DQ lines LDQ, and the sense amplifiers SA in an MRAM according to a fifth embodiment. In the fifth embodiment, a plurality of memory cells MC corresponding to n pairs of bit lines BLi and BLi+1, where n is an integer, are defined as one column block CB. The local DQ lines LDQ and the sense amplifiers SA are configured to be able to simultaneously access n-bit data for every column block CB. The memory cell array MCA can be configured similarly (rectangular wave configuration) to the memory cell array MCA according to the first embodiment.

For example, in FIG. 17, the memory cells MC corresponding to four pairs of bit lines BLi and BLi+1 constitute each of column blocks CB(N−1), CB(N), CB(N+1), and the like, where N is an integer (hereinafter, also simply "column blocks CB"). Four sense amplifiers SA_A0 to SA_A3 and four sense amplifiers SA_B0 to SA_B3 (hereinafter, also simply "sense amplifiers SA") are arranged on the both sides of the memory cell array MCA, respectively.

Local DQ lines LDQ_A0 to LDQ_A3 and LDQ_B0 to LDQ_B3 (hereinafter, also simply "local DQ lines LDQ") and transfer gates XFER_A and XFER_B (hereinafter, also simply "transfer gates XFER") are provided between the sense amplifiers SA and the column blocks CB.

Each of the transfer gates XFER is connected between one bit line BL and one local DQ line LDQ, and controlled to be turned on or off by a column select line CSL. When the corresponding column block CB is selected, each of the transfer gates XFER connects the bit line BL in the selected column block CB to the sense amplifier SA via the local DQ line LDQ.

The local DQ lines LDQ are configured to be able to connect the transfer gates XFER to the sense amplifiers SA, respectively, or to connect the transfer gates XFER to the reference voltage VSS (a ground potential). The reference voltage VSS is applied by clamp circuits CLAMP_A and CLAMP_B. The sense amplifiers SA_Ai and the clamp circuit CLAMP_B are driven in response to a control signal ENBL_even, for example. The sense amplifiers SA_Bi and the clamp circuit CLAMP_A are driven in response to a control signal ENBL_odd, for example.

With the configuration of the MRAM according to the fifth embodiment, it is possible to selectively connect one of the column blocks CB to the local DQ lines LDQ, and read data from or write data to the selected column block CB.

For example, it is assumed that the column select line CSL(N) selects the column block CB(N). In this case, the column select line CSL(N) turns on the transfer gates XFER_A and XFER_B between the column block CB(N) and the sense amplifiers SA. The bit lines BL0, BL2, BL4, and BL6 are thereby connected to the local DQ lines LDQ_A0 to LDQ_A3, and the bit lines BL1, BL3, BL5, and BL7 are thereby connected to the local DQ lines LDQ_B0 to LDQ_B3, respectively.

When one of the word lines WL0, WL2, WL4, and the like is selected, the control signal ENBL_even is activated to drive the sense amplifiers SA_A and the clamp circuit CLAMP_B. The bit lines BL0, BL2, BL4, and BL6 are thereby connected to the sense amplifiers SA_A via the local DQ lines LDQ_A0 to LDQ_A3, respectively. In addition, the bit lines BL1, BL3, BL5, and BL7 are connected to the reference voltage VSS via the local DQ lines LDQ_B0 to LDQ_B3, respectively. The sense amplifiers SA_A0 to SA_A3 thereby perform a data read operation.

When one of the word lines WL1, WL3, WL5, and the like is selected, the control signal ENBL_odd is activated to drive the sense amplifiers SA_B and the clamp circuit CLAMP_A. The bit lines BL1, BL3, BL5, and BL7 are thereby connected to the sense amplifiers SA_B via the local DQ lines LDQ_B0 to LDQ_B3, respectively. In addition, the bit lines BL0, BL2, BL4, and BL6 are connected to the reference voltage VSS via the local DQ lines LDQ_A0 to LDQ_A3, respectively. The sense amplifiers SA_A0 to SA_B3 thereby perform the data read operation.

In this manner, the sense amplifiers SA_Ai detect the data stored in the memory cells MC connected to the even-number word lines WL, and the sense amplifiers SA_Bi detect the data stored in the memory cells MC connected to the odd-number word lines WL.

Because a plurality of column blocks CB share the sense amplifiers SA, the total number of the sense amplifiers SA can be decreased. In turn, this can contribute to reducing the chip size of the MRAM, and this leads to cost reduction.

Sixth Embodiment

Figure 18:
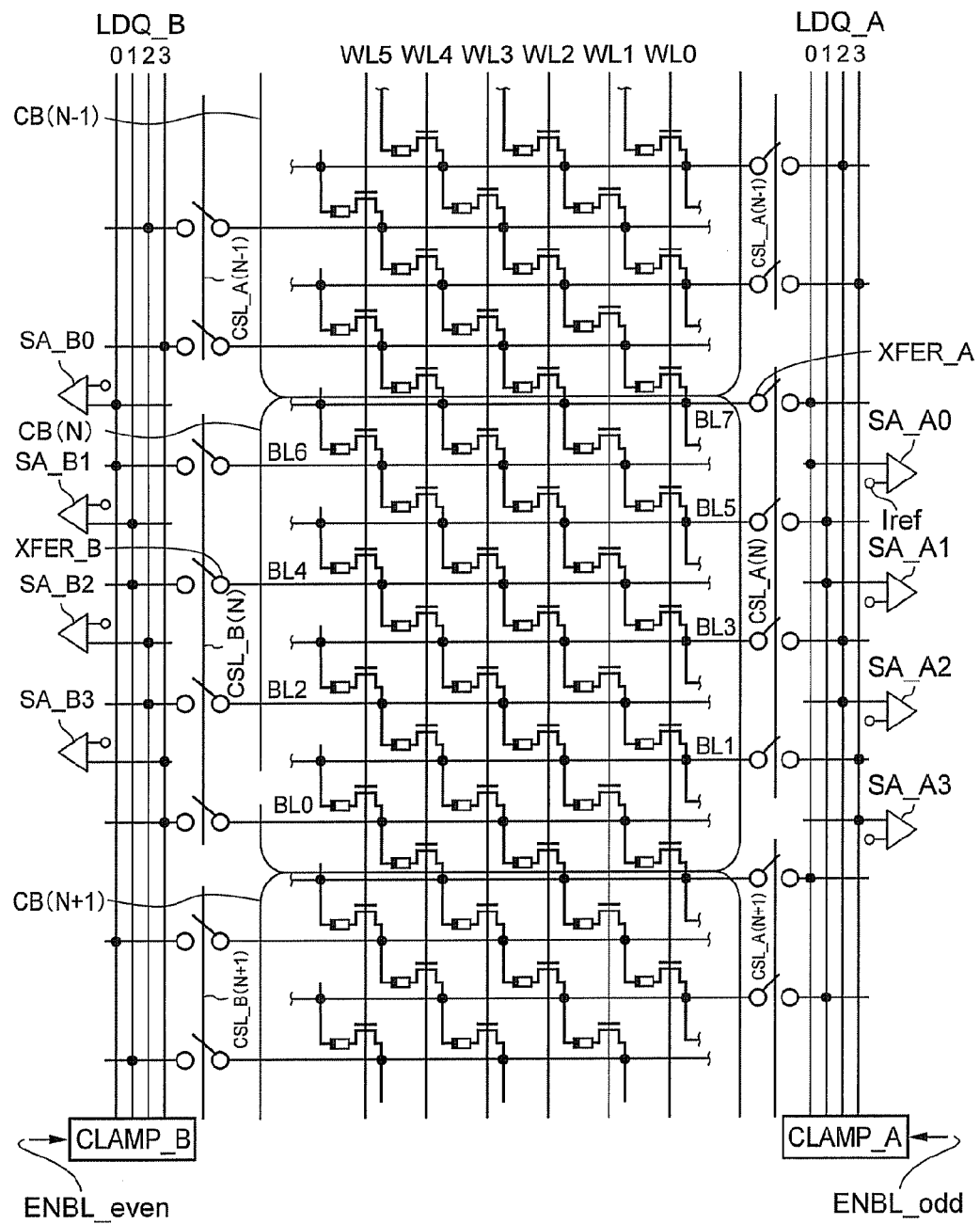
FIG. 18 is a schematic diagram showing a configuration example of the memory cell array MCA, local DQ lines LDQ, and the sense amplifiers SA in an MRAM according to a sixth embodiment.

FIG. 18 is a schematic diagram showing a configuration example of the memory cell array MCA, local DQ lines LDQ, and the sense amplifiers SA in an MRAM according to a sixth embodiment. The sixth embodiment differs from the fifth embodiment in that the memory cell array MCA has the same (staircase) configuration as that of the memory cell array MCA according to the second embodiment. The MRAM according to the sixth embodiment can be configured similarly to that according to the fifth embodiment in other aspects. Therefore, the connection relation between the sense amplifiers SA and the column blocks CB according to the sixth embodiment can be regarded as the same as that according to the fifth embodiment.

In the sixth embodiment, the bit lines BL to be paired at the time of the data read operation or the data write operation change depending on the selected word line WL. Accordingly, it suffices to change the connection relation between the column blocks CB and the sense amplifiers SA and that between the column blocks CB and the reference voltage VSS.

For example, it is assumed that the column select line CSL(N) selects the column block CB(N). In this case, the column select line CSL(N) turns on the transfer gates XFER_A and XFER_B between the column block CB(N) and the sense amplifiers SA.

The bit lines BL1, BL3, BL5, and BL7 are thereby connected to the local DQ lines LDQ_A0 to LDQ_A3, and the bit lines BL0, BL2, BL4, and BL6 are thereby connected to the local DQ lines LDQ_B0 to LDQ_B3, respectively.

When one of the word lines WL0, WL2, WL4, and the like is selected, the control signal ENBL_even is activated to drive the sense amplifiers SA_A and the clamp circuit CLAMP_B. The bit lines BL1, BL3, BL5, and BL7 are thereby connected to the sense amplifiers SA_A via the local DQ lines LDQ_A0 to LDQ_A3, respectively. In addition, the bit lines BL0, BL2, BL4, and BL6 are connected to the reference voltage VSS via the local DQ lines LDQ_B0 to LDQ_B3, respectively. The sense amplifiers SA_A0 to SA_A3 thereby perform a data read operation. At this time, the paired bit lines BL are (BL1, BL2), (BL3, BL4), (BL5, BL6), and the like. As for the unselected column blocks CB, the potentials of the respective bit lines BL are fixed to the reference voltage VSS or the transfer gates XFER_B connected to the unselected column blocks CB are turned on.

When one of the word lines WL1, WL3, WL5, and the like is selected, the control signal ENBL_odd is activated to drive the sense amplifiers SA_B and the clamp circuit CLAMP_A. The bit lines BL1, BL3, BL5, and BL7 are thereby connected to the reference voltage VSS via the local DQ lines LDQ_A0 to LDQ_A3, respectively. In addition, the bit lines BL0, BL2, BL4, and BL6 are connected to the sense amplifiers SA_B via the local DQ lines LDQ_B0 to LDQ_B3, respectively. The sense amplifiers SA_B0 to SA_B3 thereby perform a data read operation. At this time, the paired bit lines BL are (BL0, BL1), (BL2, BL3), (BL4, BL5), and the like. As for the unselected column blocks CB, the potentials of the respective bit lines BL are fixed to the reference voltage VSS or the transfer gates XFER_A connected to the unselected column blocks CB are turned on.

Because a plurality of column blocks CB share the sense amplifiers SA, the total number of the sense amplifiers SA can be decreased. In turn, this can contribute to reducing the chip size of the MRAM, and this leads to cost reduction.

(Modification of Fifth Embodiment)

Figure 19:
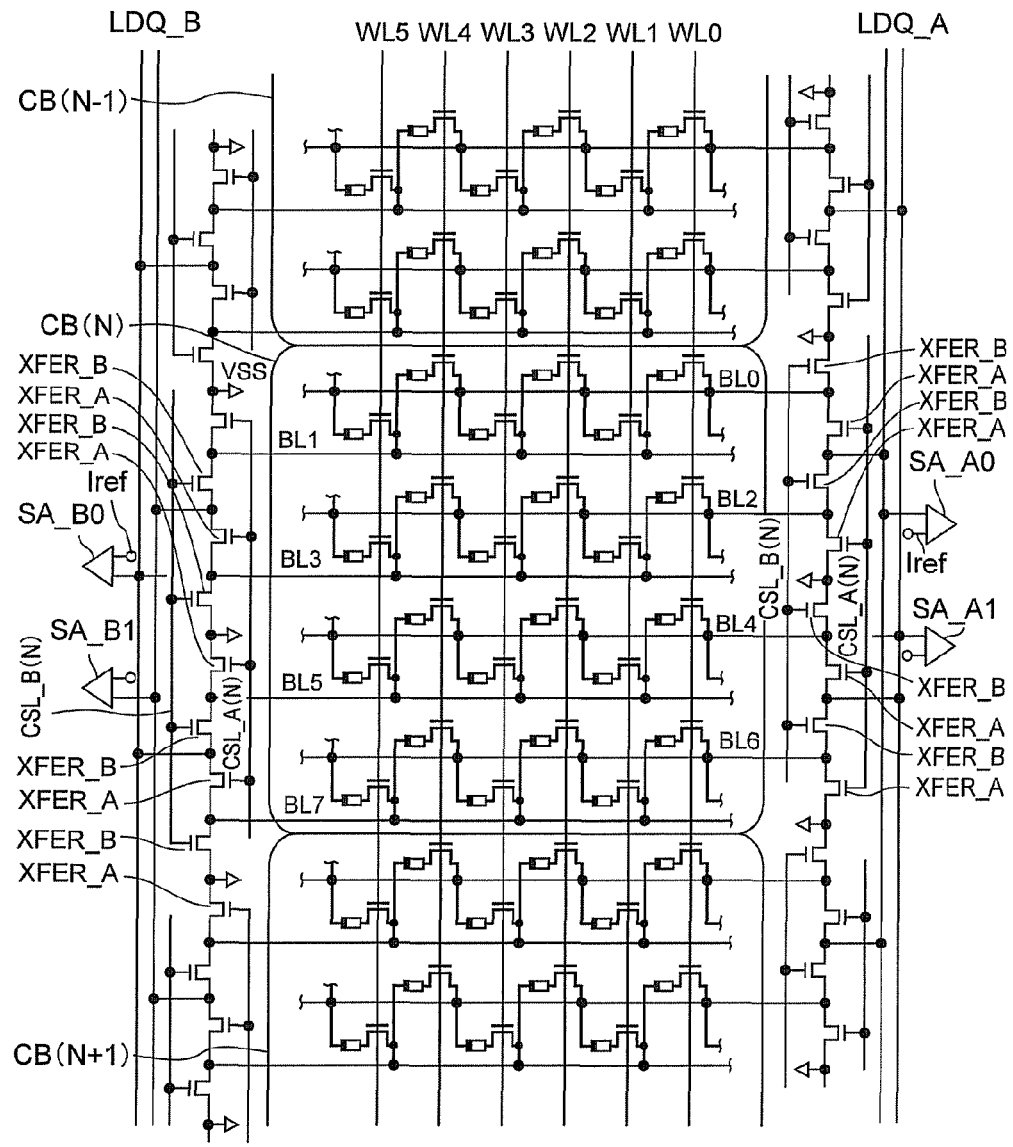
FIG. 19 is a schematic diagram showing a configuration example of the memory cell array MCA, the local DQ lines LDQ, the transfer gates XFER, and the sense amplifiers SA in an MRAM according to a modification of the fifth embodiment.

FIG. 19 is a schematic diagram showing a configuration example of the memory cell array MCA, the local DQ lines LDQ, the transfer gates XFER, and the sense amplifiers SA in an MRAM according to a modification of the fifth embodiment. The MRAM according to the present modification is configured to connect one of each pair of bit lines BLi and BLi+1 to the sense amplifier SA via the local DQ line LDQ and to connect the other bit line BLi or BLi+1 to the reference voltage VSS without via the local DQ line LDQ. The sense amplifiers SA provided on the both sides of the memory cell array MCA can thereby simultaneously read data. For example, to read n-bit data from one column block CB, it suffices to provide n/2 sense amplifiers SA on each side of the memory cell array MCA.

The memory cell array MCA can be configured similarly (rectangular wave configuration) to that according to the first embodiment.

For example, in FIG. 19, the memory cells MC corresponding to four pairs of bit lines BLi and BLi+1 constitute one column block CB. The two sense amplifiers SA_A and the two sense amplifiers SA_B are arranged on the both sides of the memory cell array MCA, respectively. The local DQ lines LDQ_A and LDQ_B and transfer gates XFER_A and XFER_B are provided between the sense amplifiers SA and the column blocks CB.

Each of the transfer gates XFER is connected between one bit line BL and one local DQ line LDQ, and controlled to be turned on or off by the column select line CSL. When the corresponding column block CB is selected, each of the transfer gates XFER connects the bit line BL in the selected column block CB to the sense amplifier SA via the local DQ line LDQ. Alternatively, when the corresponding column block CB is selected, each of the transfer gates XFER connects the bit line BL in the selected column block CB directly to the reference voltage VSS without via the local DQ line LDQ.

The sense amplifiers SA are connected to the corresponding local DQ lines LDQ, respectively.

For example, when a column select line CSL_A(N) is activated, the sense amplifier SA_A0 on the right side of the column block CB(N) is connected to the bit line BL0 via one local DQ line LDQ_A and the sense amplifier SA_A1 is connected to the bit line BL4 via one local DQ line LDQ_A. Furthermore, the sense amplifier SA_B0 on the left side of the column block CB(N) is connected to the bit line BL7 via one local DQ line LDQ_B, and the sense amplifier SA_B1 is connected to the bit line BL3 via one local DQ line LDQ_B.

On the other hand, the bit lines BL1 and BL5 are connected to the reference voltage VSS via the transfer gates XFER_A, and the bit lines BL2 and BL6 are connected to the reference voltage VSS via the transfer gates XFER_B, respectively.

The sense amplifiers SA_A0, SA_A1, SA_B0, and SA_B1 thereby detect data stored in the memory cells MC via the bit lines BL0, BL4, BL7, and BL3, respectively. That is, the sense amplifiers SA can simultaneously detect four-bit data.

When a column select line CSL_B(N) is activated, the sense amplifier SA_A0 is connected to the bit line BL2 via one local DQ line LDQ_A and the sense amplifier SA_A1 is connected to the bit line BL6 via one local DQ line LDQ_A. Furthermore, the sense amplifier SA_B0 is connected to the bit line BL5 via one local DQ line LDQ_B, and the sense amplifier SA_B1 is connected to the bit line BL1 via one local DQ line LDQ_B.

On the other hand, the bit lines BL0 and BL4 are connected to the reference voltage VSS via the transfer gates XFER_A, and the bit lines BL3 and BL7 are connected to the reference voltage VSS via the transfer gates XFER_B, respectively.

The sense amplifiers SA_A0, SA_A1, SA_B0, and SA_B1 thereby detect data stored in the memory cells MC via the bit lines BL2, BL6, BL5, and BL1, respectively. In this case, similarly to the case described above, the sense amplifiers SA can simultaneously detect four-bit data.

For example, in the MRAM, when the even-number word lines WL0, WL2, WL4, and the like are selected, the column select line CSL_A(N) is activated to read the data. When the odd-number word lines WL1, WL3, WL5, and the like are selected, the column select line CSL_B(N) is activated to read the data.

By allowing the MRAM to operate as described above, the cell currents Icell flow to the memory cells MC in the same direction (A2 in FIG. 2). In the present modification like the modification of the first embodiment, the read margin can be increased.

According to the present modification, the number of the sense amplifiers SA can be decreased because a plurality of column blocks CB share the sense amplifiers SA. Moreover, each of the transfer gates XFER selectively connects one of the two bit lines BL to one local DQ line LDQ. Therefore, all the local DQ lines LDQ arranged on the both sides of the column block CB can be connected to the bit lines BL at the time of the data read operation and the data write operation. As a result, it suffices to arrange as many sense amplifiers SA as bits of the data to be read simultaneously on the both sides of the column block CB. In turn, this can contribute to reducing the chip size of the MRAM, and this leads to cost reduction.

(Modification of Sixth Embodiment)

Figure 20:
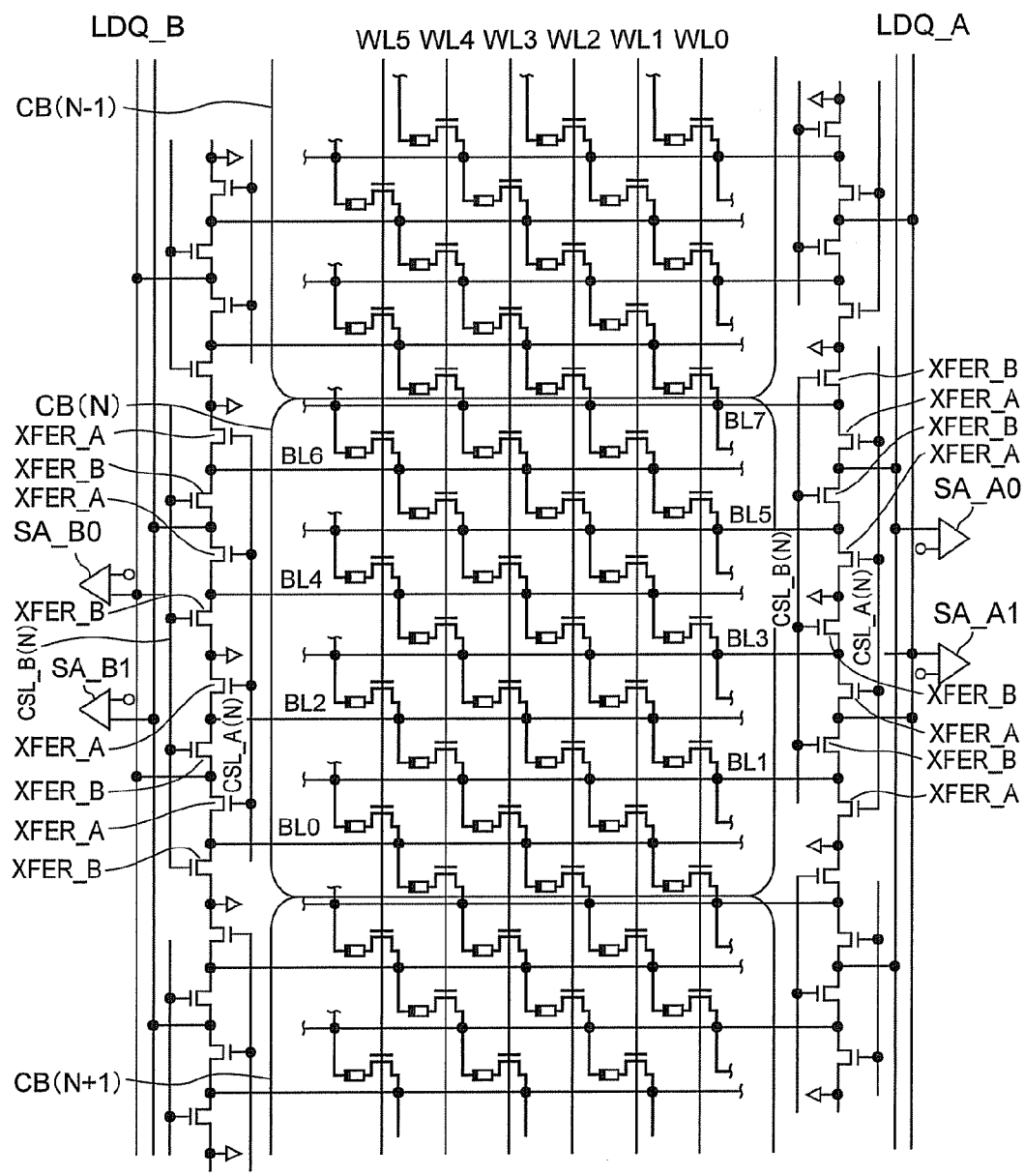
FIG. 20 is a schematic diagram showing a configuration example of the memory cell array MCA, the local DQ lines LDQ, the transfer gates XFER, and the sense amplifiers SA in an MRAM according to a modification of the sixth embodiment.

FIG. 20 is a schematic diagram showing a configuration example of the memory cell array MCA, the local DQ lines LDQ, the transfer gates XFER, and the sense amplifiers SA in an MRAM according to a modification of the sixth embodiment. In the present modification, the modification of the fifth embodiment is applied to the sixth embodiment.

The modification of the sixth embodiment differs from that of the fifth embodiment in that the memory cell array MCA has the same (staircase) configuration as that of the memory cell array MCA according to the second embodiment. The MRAM according to the modification of the sixth embodiment can be configured similarly to that according to the modification of the fifth embodiment in other aspects. Therefore, the connection relation between the sense amplifiers SA and the column blocks CB according to the modification of the sixth embodiment can be regarded as the same as that according to the modification of the fifth embodiment.

In the modification of the sixth embodiment, the bit lines BL to be paired at the time of the data read operation or the data write operation change depending on the selected word line WL. Accordingly, it suffices to change the connection relation between the column blocks CB and the sense amplifiers SA and that between the column blocks CB and the reference voltage VSS.

For example, when the column select line CSL_A(N) is activated, the sense amplifier SA_A0 is connected to the bit line BL7 via one local DQ line LDQ_A and the sense amplifier SA_A1 is connected to the bit line BL3 via one local DQ line LDQ_A. Furthermore, the sense amplifier SA_B0 on the left side of the column block CB(N) is connected to the bit line BL0 via one local DQ line LDQ_B, and the sense amplifier SA_B1 is connected to the bit line BL4 via one local DQ line LDQ_B.

On the other hand, the bit lines BL1 and BL5 are connected to the reference voltage VSS via the transfer gates XFER_A, and the bit lines BL2 and BL6 are connected to the reference voltage VSS via the transfer gates XFER_B, respectively.

As for the unselected column blocks CB, the potentials of the respective bit lines BL are fixed to the reference voltage VSS or the transfer gates XFER_B connected to the unselected column blocks CB are turned on.

The sense amplifiers SA_A0, SA_A1, SA_B0, and SA_B1 thereby detect data stored in the memory cells MC via the bit lines BL7, BL3, BL0, and BL4, respectively. That is, the sense amplifiers SA can simultaneously detect four-bit data.

When the column select line CSL_B(N) is activated, the sense amplifier SA_A0 is connected to the bit line BL5 via one local DQ line LDQ_A and the sense amplifier SA_A1 is connected to the bit line BL1 via one local DQ line LDQ_A. Furthermore, the sense amplifier SA_B0 is connected to the bit line BL2 via one local DQ line LDQ_B, and the sense amplifier SA_B1 is connected to the bit line BL6 via one local DQ line LDQ_B.

On the other hand, the bit lines BL3 and BL7 are connected to the reference voltage VSS via the transfer gates XFER_A, and the bit lines BL0 and BL4 are connected to the reference voltage VSS via the transfer gates XFER_B, respectively.

As for the unselected column blocks CB, the potentials of the respective bit lines BL are fixed to the reference voltage VSS or the transfer gates XFER_B connected to the unselected column blocks CB are turned on.

The sense amplifiers SA_A0, SA_A1, SA_B0, and SA_B1 thereby detect data stored in the memory cells MC via the bit lines BL5, BL1, BL2, and BL6, respectively. In this case, similarly to the case described above, the sense amplifiers SA can simultaneously detect four-bit data.

For example, in the MRAM, when the odd-number word lines WL1, WL3, WL5, and the like are selected, the column select line CSL_A(N) is activated to read the data. Therefore, the paired bit lines BL are (BL0, BL1), (BL2, BL3), (BL4, BL5), and the like. The sense amplifiers SA can detect the data via the bit lines BL7, BL3, B0, and BL4.

In the MRAM, when the even-number word lines WL0, WL2, WL4, and the like are selected, the column select line CSL_B(N) is activated to read the data. Therefore, the paired bit lines BL are (BL1, BL2), (BL3, BL4), (BL5, BL6), and the like. The sense amplifiers SA can detect the data via the bit lines BL5, BL1, BL2, and BL6.

The modification of the sixth embodiment can achieve effects identical to those of the modification of the fifth embodiment.

By allowing the MRAM to operate as described above, the cell currents Icell flow to the memory cells MC in the same direction (A2 in FIG. 2). In the present modification like the modification of the second embodiment, the read margin can be increased.

While the data read operation has been mainly described in the embodiments and modifications, it suffices to carry a write current to the memory cells MC according to the write data as described with reference to FIG. 2.

As the cell transistor CT constituting each memory cell MC, an arbitrary transistor such as a planar MOSFET (Metal-Oxide Semiconductor Field Effect Transistor), a so-called FinFET, a Dual-Channel FinFET, a GAA (Gate All Around) transistor, or an Si Nanowire transistor can be used.

Furthermore, while the MRAM has been described in each of the embodiments as an example of the semiconductor storage device, the embodiments are also applicable to a semiconductor storage device such as a PCRAM or an RRAM using the other resistance storage elements.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a semiconductor substrate;
a plurality of memory cells on an upper portion of or above the semiconductor substrate, the memory cells including storage elements storing therein data and switching elements;
a plurality of active areas, on which the switching elements of the memory cells are respectively formed, isolated from one another to correspond to the memory cells, respectively, and arranged on the semiconductor substrate in a first direction, the active areas adjacent in a second direction substantially orthogonal to the first direction being arranged to be half-pitch-staggered in the first direction; and
a plurality of upper electrodes each connecting one end of the storage element of a first memory cell to the switching element of a second memory cell adjacent to the first memory cell in the second direction and to a bit line, the first and second memory cells being among the plurality of memory cells.

2. The device of claim 1, wherein
the active areas respectively have a shape extending in the first direction,
the upper electrodes respectively have a shape extending in the second direction, and
the active areas and the upper electrodes are arranged to appear to be of a continuous rectangular wave shape or a continuous staircase shape as viewed from above a surface of the semiconductor substrate.

3. The device of claim 2, wherein
the upper electrodes respectively have a shape extending in the second direction, and
ends of the two upper electrodes adjacent to each other in the first direction are uniformly arranged in the second direction.

4. The device of claim 2, wherein
the upper electrodes respectively have a shape extending in the second direction, and
two upper electrodes adjacent to each other in the first direction among the plurality of upper electrodes are arranged to be half-pitch-staggered in the second direction.

5. A semiconductor storage device comprising:
a plurality of bit lines;
a plurality of word lines; and
a plurality of memory cells each including a storage element and a switching element which are connected in series between adjacently paired ones of the bit lines, each gate node of the switching elements of the memory cells connected between one of the adjacently paired ones of the bit lines being respectively connected to different ones of the word lines, wherein
a plurality of the storage elements and a plurality of the switching elements of the adjacent memory cells are alternately connected in series.

6. The device of claim 5, wherein
the storage element of a first memory cell among the plurality of memory cells is connected to the switching element of a second memory cell adjacent to the first memory cell, and
the storage element of the second memory cell is connected to the switching element of a third memory cell further adjacent to the second memory cell.

7. The device of claim 6, wherein the first, second, and third memory cells are connected between a same pair of the bit lines.

8. The device of claim 7, wherein data is read from or written to the first, second, or third memory cell via the same pair of the bit lines which is connected to the first, second, and third memory cells, when the data is read from or written to the first, second, or third memory cell.

9. The device of claim 6, wherein
the first memory cell is connected between a first bit line and a second bit line adjacent to the first bit line, the first and second bit lines being among the plurality of bit lines,
the second memory cell is connected between the second bit line and a third bit line adjacent to the second bit line, the third bit line being among the plurality of bit lines, and
the third memory cell is connected between the third bit line and a fourth bit line adjacent to the third bit line, the fourth bit line being among the plurality of bit lines.

10. The device of claim 9, wherein
data is read from or written to the first memory cell via a pair of the first and second bit lines, when the data is read from or written to the first memory cell,
data is read from or written to the second memory cell via a pair of the second and third bit lines, when the data is read from or written to the second memory cell, and
data is read from or written to the third memory cell via a pair of the third and fourth bit lines, when the data is read from or written to the third memory cell.

11. The device of claim 1, wherein the storage element is a magnetic tunnel junction element.

12. The device of claim 5, wherein the storage element is a magnetic tunnel junction element.

13. The device of claim 1, wherein
the storage element is connected to one end of the switching element, and
the device further comprises:
a lower contact connected to the other end of the switching element; and
an upper contact provided above the lower contact via one of the upper electrodes.

14. The device of claim 1, wherein
the storage element is connected to one end of the switching element, and
the device further comprises:
a lower contact connected to the other end of the switching element; and
an upper contact provided above the storage element via one of the upper electrodes.

15. The device of claim 1, wherein the switching element is a transistor.

16. The device of claim 5, wherein the switching element is a transistor.

* * * * *